(12) United States Patent
Ide et al.

(10) Patent No.: US 9,112,433 B2
(45) Date of Patent: Aug. 18, 2015

(54) POWER GENERATION UNIT, BATTERY, ELECTRONIC APPARATUS, TRANSPORTATION DEVICE, AND METHOD OF CONTROLLING POWER GENERATION UNIT

(71) Applicant: SEIKO EPSON CORPORATION, Tokyo (JP)

(72) Inventors: Noritaka Ide, Shiojiri (JP); Atsuya Hirabayashi, Chino (JP); Kunio Tabata, Shiojiri (JP); Atsushi Oshima, Shiojiri (JP); Hiroyuki Yoshino, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 417 days.

(21) Appl. No.: 13/633,187

(22) Filed: Oct. 2, 2012

(65) Prior Publication Data

US 2013/0082565 A1 Apr. 4, 2013

(30) Foreign Application Priority Data

Oct. 3, 2011 (JP) ................. 2011-218921
Oct. 3, 2011 (JP) ................. 2011-219033

(51) Int. Cl.
*H01L 41/09* (2006.01)
*H02N 2/18* (2006.01)
*H01L 41/113* (2006.01)

(52) U.S. Cl.
CPC ............ *H02N 2/181* (2013.01); *H01L 41/1136* (2013.01)

(58) Field of Classification Search
USPC ......................................... 310/317–319, 339
See application file for complete search history.

(56) References Cited

U.S. PATENT DOCUMENTS

| 5,552,656 | A  | 9/1996 | Taylor |
| 5,801,475 | A  | 9/1998 | Kimura |
| 6,252,336 | B1 | 6/2001 | Hall |
| 6,522,048 | B1 | 2/2003 | Burns et al. |
| 8,026,650 | B2 | 9/2011 | Ramadass et al. |
| 8,368,290 | B2 | 2/2013 | Kwon et al. |

(Continued)

FOREIGN PATENT DOCUMENTS

| JP | 07-107752 A   | 4/1995 |
| JP | 2005-312269 A | 11/2005 |

(Continued)

OTHER PUBLICATIONS

E. Lefeuvre et al., "A comparison between several vibration-powered piezoelectric generators for standalone systems", Sensors and Actuators A: Physical, vol. 126, Issue 2, Feb. 14, 2006, pp. 405-416.

*Primary Examiner* — Thomas Dougherty
(74) *Attorney, Agent, or Firm* — Maschoff Brennan

(57) ABSTRACT

A power generation unit includes a deforming member adapted to deform while switching a deformation direction, a piezoelectric device provided to the deforming member, a displacement detection section adapted to detect that the deforming member is displaced beyond a predetermined level, an inductor electrically connected to the piezoelectric device, a switch disposed between the piezoelectric device and the inductor, and a control section adapted to set the piezoelectric device and the inductor to an electrically conductive state via the switch if the displacement detection section detects that the deforming member is displaced beyond the predetermined level.

17 Claims, 17 Drawing Sheets

(56) References Cited

U.S. PATENT DOCUMENTS

| | | |
|---|---|---|
| 8,373,332 B2 | 2/2013 | Lee |
| 2010/0102782 A1 | 4/2010 | Thiesen et al. |
| 2011/0140579 A1* | 6/2011 | Moon et al. ............. 310/339 |
| 2012/0068576 A1* | 3/2012 | Lee ........................ 310/339 |
| 2012/0119618 A1 | 5/2012 | Tabata et al. |
| 2012/0126666 A1 | 5/2012 | Tabata et al. |
| 2012/0280596 A1 | 11/2012 | Ide et al. |
| 2013/0082570 A1* | 4/2013 | Ide et al. ................. 310/319 |
| 2013/0083569 A1* | 4/2013 | Minoura et al. ........... 363/37 |
| 2014/0062389 A1* | 3/2014 | Ide et al. ................. 320/107 |
| 2014/0071722 A1* | 3/2014 | Gao et al. ................. 363/80 |

FOREIGN PATENT DOCUMENTS

| | | |
|---|---|---|
| JP | 4835888 B1 | 12/2011 |
| JP | 4835889 B1 | 12/2011 |

\* cited by examiner

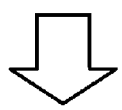

FIG. 5D  SW

OFF STATE

ON STATE (1)

OFF STATE

ON STATE (1)

POWER GENERATION UNIT, BATTERY, ELECTRONIC APPARATUS, TRANSPORTATION DEVICE, AND METHOD OF CONTROLLING POWER GENERATION UNIT

BACKGROUND

1. Technical Field

The present invention relates to a power generation unit for taking out the charge, which is generated when a piezoelectric material such as a piezoelectric device is deformed in response to an external force, as electrical energy, a method of controlling the power generation unit, a battery, an electronic apparatus, and a transportation device including the power generation unit.

2. Related Art

When a piezoelectric material such as lead zirconium titanate (PZT), quartz crystal ($SiO_2$), or zinc oxide (ZnO) is deformed, electrical polarization is induced inside the material, and positive and negative charges appear on the surface. Such a phenomenon is called a so-called piezoelectric effect. There has been proposed an electrical power generation method of vibrating a cantilever to thereby make a weight repeatedly act on the piezoelectric material, and thus taking out the charge generated on the surface of the piezoelectric material as electricity using such a characteristic provided to the piezoelectric material.

For example, by vibrating a metal cantilever having a mass disposed at the tip and a thin plate made of the piezoelectric material bonded thereto, and taking out the positive and negative charges alternately generated on the piezoelectric material due to the vibration, an alternating current is generated. JP-A-7-107752 proposes a technology of rectifying the alternating current using diodes, and then storing the result in a capacitor, and then taking it out as electricity. JP-A-2005-312269 proposes a technology of arranging that a junction is closed only during the period in which the positive charges are generated in a piezoelectric device to thereby make it possible to obtain a direct current without causing a voltage loss in the diodes. Since it is possible to miniaturize the power generation unit by using these technologies, there is expected an application of, for example, incorporating the power generation unit in, for example, a small-sized electronic component instead of a battery.

However, in the proposed technology according to the related art, there arises a problem that the obtainable voltage is limited up to the voltage generated by the electrical polarization of the piezoelectric material. Therefore, in most cases, an additional step-up circuit is required, and there arises a problem that it is difficult to sufficiently miniaturize the power generation unit.

SUMMARY

An advantage of some aspects of the invention is to provide a technology capable of efficiently generating a high voltage in a small-sized power generation unit using the piezoelectric effect of the piezoelectric material.

(1) An aspect of the invention is directed to a power generation unit including a deforming member adapted to deform while switching a deformation direction, a piezoelectric device provided to the deforming member, a displacement detection section adapted to detect that the deforming member is displaced beyond a predetermined level, an inductor electrically connected to the piezoelectric device, a switch disposed between the piezoelectric device and the inductor, and a control section adapted to set the piezoelectric device and the inductor to an electrically conductive state via the switch if the displacement detection section detects that the deforming member is displaced beyond the predetermined level.

According to this aspect of the invention, since the piezoelectric device is provided to the deforming member, if the deforming member deforms, the piezoelectric device also deforms. As a result, positive and negative charges are generated in the piezoelectric device due to the piezoelectric effect. The generation amount of the charge increases as the deformation amount of the piezoelectric device increases. The piezoelectric device constitutes a resonant circuit together with the inductor, and the switch is disposed between the piezoelectric device and the inductor. The deformation of the deforming member is started in the state in which the conduction in the switch is cut, and the control section set the switch to the conductive state when the deforming member is displaced beyond a predetermined level (which corresponds to the time, for example, when the deformation direction is switched). Since the piezoelectric device deforms with the deforming member, and generates more charge as the deformation amount increases, when the charge generated in the piezoelectric device reaches the maximum value, the piezoelectric device is connected to the inductor to thereby form the resonant circuit. Then, the charges generated in the piezoelectric device flows into the inductor. Since the piezoelectric device and the inductor forms the resonant circuit, the current having flown into the inductor overshoots, and then flows into the terminal on the opposite side of the piezoelectric device. This period (i.e., the period until the charge flown out from one terminal of the piezoelectric device flows again into the piezoelectric device through the other terminal via the inductor) is a half of the resonance period of the resonant circuit composed of the piezoelectric device and the inductor. Therefore, by forming the resonant circuit by setting the switch to the conductive state when the deformation direction of the piezoelectric device is switched, and then setting the switch to the nonconductive state when the time period half as long as the resonance period has elapsed, it is possible to reverse the locations of the positive and negative charges having been generated in the piezoelectric device before connecting the inductor. By deforming the deforming member in turn in the opposite direction in that state, the piezoelectric device is also deformed in the opposite direction, and therefore, the charges are accumulated within the piezoelectric device in such a manner that the new charges further generated by the piezoelectric effect in the state in which the locations of the positive and negative charges are reversed are stacked incrementally thereon. Since the voltage generated also increases as the charges are stored in the piezoelectric device, it is possible to generate a voltage higher than the voltage generated by the electrical polarization of the piezoelectric material forming the piezoelectric device without additionally preparing a step-up circuit. Further, in order to efficiently accumulate the charges in the piezoelectric device in such a manner, it is important to connect the switch when the deformation direction of the piezoelectric device is switched to thereby form the resonant circuit. Here, the power generation unit according to the aspect of the invention is provided with the displacement detection section for detecting the fact that the deforming member has been displaced beyond the predetermined level. The displacement detection section can be provided with, for example, a mechanical contact, but is not limited thereto. In the case in which the displacement detection section has the mechanical contact, the control section can switch between the electrically conductive state and the electrically nonconductive state between the piezoelectric device and the inductor based on, for example, the contact the deforming member has with the mechanical contact. In other words, the power generation unit according to this aspect of the invention is capable of directly detecting the displacement of the deforming member using the displacement detection section. The control section sets the switch provided to the resonant circuit to the conductive state for a predetermined period from the switching (which corresponds to, e.g., conductive state of the displacement detection section) of the deformation direction of the piezoelectric device, it becomes possible to efficiently store the charge in the piezoelectric device. Therefore, in the small-sized power generation unit using the piezoelectric effect, it is possible to efficiently generate a high voltage.

(2) The power generation unit according to the above aspect of the invention may be configured such that the displacement detection section is a mechanical switch having a mechanical contact, and the piezoelectric device and the inductor are set to the electrically conductive state if the deforming member has contact with the mechanical switch.

(3) The power generation unit according to the above aspect of the invention may be configured such that the power generation unit further includes a timing calculation section adapted to generate a timing at which a deformation direction of the deforming member is switched, and the control section sets the piezoelectric device and the inductor to one of a conductive state and a nonconductive state using the switch with the timing generated by the timing calculation section.

According to these configurations, the displacement detection section can be a mechanical switch having a mechanical contact. The number of the displacement detection sections can be one. It is also possible that the piezoelectric device and the inductor are set to the electrically conductive state or the electrically nonconductive state if one of the surfaces of the deforming member opposed to the displacement detection section has contact with the mechanical switch (which can be shaped like a button) of the displacement detection section. On this occasion, the fact that the deforming member has been displaced beyond a predetermined level can directly be figured out by the mechanical switch having contact with the deforming member.

Here, it is also possible to provide the timing calculation section adapted to generate a timing at which the deformation direction of the deforming member is switched. One cycle of the vibration of the deforming member can be figured out from the timing at which one displacement detection section is set to the conductive state. It is also possible for the timing calculation section to obtain the timings of every half cycle by obtaining a half of the interval at which the displacement detection section is set to the conductive state by calculation. In this case, since it is sufficient to detect only one of the surfaces of the deforming member, for example, a single displacement detection section is sufficient, and therefore, the power generation unit can be miniaturized.

(4) The power generation unit according to the above aspect of the invention may be configured such that the number of the displacement detection sections is plural, a first displacement detection section as one of the displacement detection sections detects that a first surface as one of surfaces of the deforming member is displaced beyond a predetermined level, and a second displacement detection section different from the first displacement detection section detects that a surface different from the first surface is displaced beyond a predetermined level.

According to this configuration, there is disposed a plurality of displacement detection sections, and a first displacement detection section and the second displacement detection section are included. The first displacement detection section detects the displacement of one (a first surface) of the surfaces of the deforming member, and the second displacement detection section detects the displacement of another of the surfaces of thereof different from the first surface. In this case, a half cycle of the vibration of the deforming member can be figured out from the timing at which the first or the second displacement detection section is set to the conductive state. In this case, the circuit for calculating the period such as the timing calculation section described above can be eliminated, and the power consumption necessary for calculation can be reduced.

(5) The power generation unit according to the above aspect of the invention may be configured such that the displacement detection section is provided to the deforming member.

According to this configuration, since the displacement detection section is also manufactured while being provided to the deforming member, the manufacturing process can be simplified. For example, in the case of providing the displacement detection section to the housing, it is necessary to attach the displacement detection section after assembling the whole of the power generation unit. According to this aspect of the invention, since it is possible to attach the displacement detection section in the manufacturing process of the deforming member as a component, the manufacturing process can be simplified.

(6) The power generation unit according to the above aspect of the invention may be configured such that the displacement detection section includes an elastic member.

According to this configuration, it becomes possible for the displacement detection section not only to figure out the displacement of the deforming member, but also to absorb the impact in the collision using the elastic member in the case in which the deforming member is excessively deformed due to, for example, an external force. It is assumed that, for example, the displacement detection section, which is set to the conductive state when a button with a mechanical contact is pressed, includes an elastic member acting so as to push back the button. In this case, if the deforming member is excessively deformed, since the elastic member acts as a buffer to thereby absorb the impact in the collision, the power generation unit can be protected.

(7) The power generation unit according to the above aspect of the invention may be configured such that the deforming member has a plurality of surfaces, and the displacement detection section measures the displacement of the surface of the deforming member, the surface being provided with the piezoelectric device.

According to this configuration, the surface of the deforming member measured by the displacement detection section (e.g., a sensor) is a surface provided with the piezoelectric device. Therefore, the displacement of the deforming member completely coupled to the deformation of the piezoelectric device can accurately be detected. Consequently, it is possible to efficiently generate a high voltage, namely to enhance the step-up effect.

(8) The power generation unit according to the above aspect of the invention may be configured such that the displacement detection section is a sensor, and the control section differentiates the displacement detected by the displacement detection section, and then sets the switch to an electrically conductive state for a predetermined period if a sign of the differential value changes.

According to this configuration, the control section differentiates the displacement detected by the sensor in order to detect the switching (i.e., the switching of the deformation direction of the piezoelectric device) of the direction of the displacement of the deforming member. If the change (positive to negative, or negative to positive) in the sign of the differential value occurs, the switch is set to the conductive state. In this case, even in the case in which the amplitude of the vibration of the deforming member is diverse but is not constant, it is possible to accurately capture the timing at which the deformation direction of the piezoelectric device is switched to thereby enhance the step-up effect.

(9) The power generation unit according to the above aspect of the invention may be configured such that the displacement detection section is an eddy current sensor.

(10) The power generation unit according to the above aspect of the invention may be configured such that the displacement detection section is an optical sensor.

(11) The power generation unit according to the above aspect of the invention may be configured such that the displacement detection section is an ultrasonic sensor.

(12) The power generation unit according to the above aspect of the invention may be configured such that the displacement detection section is a capacitance sensor.

According to these configurations, by selecting a sensor of a specific type as the displacement detection section, the detection accuracy can be improved. As the sensor, there can be used a contactless sensor not hindering the deformation of the piezoelectric device. There are a variety of types of contactless sensors such as an optical type, an ultrasonic type, an eddy current type, and a capacitance type. Among these sensors, the eddy current sensor includes a detection coil for generating a high-frequency magnetic field. Since an eddy current (an induction current due to the electromagnetic induction) flows through the detection object when the detection object comes closer, the impedance of the detection coil varies. The displacement can be measured based on the variation in the impedance. On the other hand, the optical sensor includes a light emitting element and an optical position detection element. Light (e.g., a laser beam) is emitted from the light emitting element toward the detection object. The surface-reflected light from the detection object passes through a light receiving lens, and forms a spot on the optical position detection element. The displacement can be measured based on the variation in the position of the spot. The eddy current sensor and the optical sensor have a high response frequency compared to those of the rest of the types. Therefore, by using the sensor of the eddy current type or the optical type, it is possible to accurately capture the timing at which the deformation direction of the piezoelectric device is switched to thereby enhance the step-up effect.

The sensor can be of the ultrasonic type or the capacitance type. The ultrasonic sensor emits an ultrasonic wave, and then receives the ultrasonic wave reflected by the target object. It is possible to calculate the accurate distance with relative ease based on the time period between the emission and the reception. The capacitance sensor measures the displacement based on the variation in the capacitance, and is therefore capable of measuring a minute displacement.

(13) The power generation unit according to the above aspect of the invention may be configured such that the displacement detection section is of one of a contact type and a contactless type.

According to this configuration, the displacement detection section can be a contact displacement detection switch having, for example, a mechanical contact, or a contactless sensor for measuring the distance using, for example, a laser beam. In either of the cases, it is possible to accurately capture the timing at which the deformation direction of the piezoelectric device is switched to thereby enhance the step-up effect.

(14) Another aspect of the invention is directed to a battery including the power generation unit according to any one of the configurations described above.

(15) Still another aspect of the invention is directed to an electronic apparatus including the power generation unit according to any one of the configurations described above.

(16) Yet another aspect of the invention is directed to a transportation device including the power generation unit according to any one of the configurations described above.

These aspects of the invention relate to a battery incorporating the power generation unit described above, a compact electronic apparatus such as a remote controller incorporating the power generation unit described above instead of a battery, and the transportation device such as a vehicle or an electric train equipped with the power generation unit described above. The electronic apparatus can generate the electrical power due to the vibration caused therein when, for example, being transported or used. The battery has a longer life than a primary cell. In the electronic apparatus, an operation such as battery change is also eliminated. It is possible for the transportation device (e.g., a vehicle and an electric train) to generate electricity by the vibration due to the transportation, and then efficiently supply, for example, the equipment provided to the transportation device with the electricity.

(17) Still yet another aspect of the invention is directed to a method of controlling a power generation unit including a deforming member adapted to deform while switching a deformation direction, a piezoelectric device provided to the deforming member, a displacement detection section adapted to detect that the deforming member is displaced beyond a predetermined level, an inductor electrically connected to the piezoelectric device, and a switch disposed between the piezoelectric device and the inductor. The method includes detecting that the deforming member is displaced beyond a predetermined level by a displacement detection section; and setting the piezoelectric device and the inductor to an electrically conductive state via the switch if the displacement detection section detects that the deforming member is displaced beyond the predetermined level.

According to this aspect of the invention, the method of controlling the power generation unit includes the step of obtaining the displacement information of the deforming member detected by the sensor, and the step of setting the switch to the conductive state for a predetermined period based on the displacement information. Firstly, the direct and accurate information of the displacement of the deforming member detected by the sensor is obtained. Therefore, even in the case of obtaining, for example, the timing of the extreme value of the displacement by calculation, an accurate timing with little error can be obtained. In the step of setting the switch to the conductive state, such an accurate timing representing the extreme value of the displacement can be used. In this case, it becomes possible to efficiently store the charges in the piezoelectric device. Therefore, in the small-sized power generation unit using the piezoelectric effect, it is possible to realize a control method capable of efficiently generating a high voltage.

BRIEF DESCRIPTION OF THE DRAWINGS

The invention will be described with reference to the accompanying drawings, wherein like numbers reference like elements.

FIGS. 5A through 5D are explanatory diagrams showing the reason that a switch SW can be controlled at appropriate timings by detecting the displacement.

DESCRIPTION OF EXEMPLARY EMBODIMENTS

Hereinafter, an embodiment of the invention will be explained along the following procedure to thereby clarify the content of the invention described above.

Figure 1A:
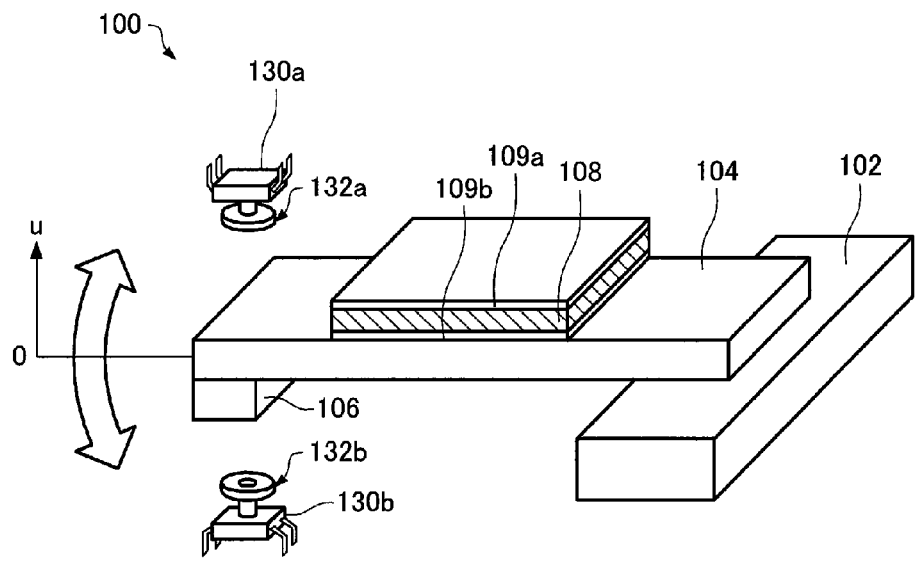
FIG. 1A is an explanatory diagram showing a structure of a power generation unit according to a first embodiment of the invention.
Figure 1B:
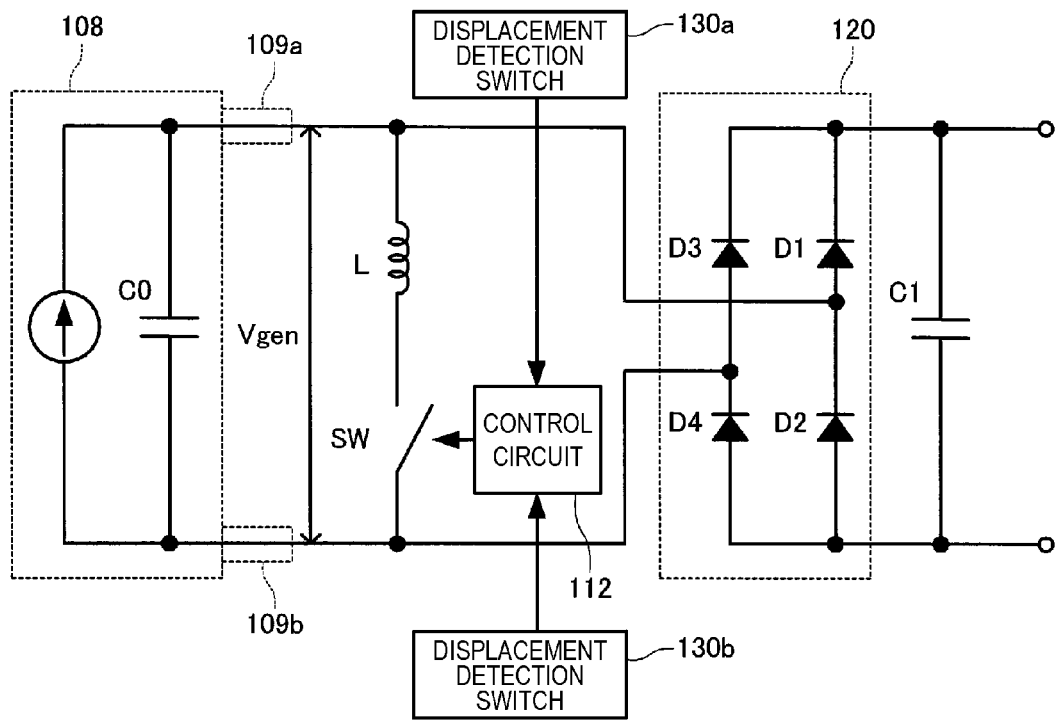
FIG. 1B is an explanatory diagram showing the structure of the power generation unit according to the first embodiment.

A. First Embodiment
A-1. Structure of Power Generation Unit
A-2. Operation of Power Generation Unit
A-3. Operation Principle of Power Generation Unit
A-4. Switching Timing of Switch
A-5. Displacement Detection Switch
B. First Modified Example
C. Second Modified Example
D. Second Embodiment
D-1. Structure of Power Generation Unit
D-2. Switching Timing of Switch
D-3. Displacement Sensor
E. Battery, Electronic Apparatus, and Transportation Device A. First Embodiment
A-1. Structure of Power Generation Unit FIGS. 1A and 1B are explanatory diagrams showing a structure of a power generation unit 100 according to the present embodiment. FIG. 1A shows a mechanical structure of the power generation unit 100, and FIG. 1B shows an electrical structure thereof. The mechanical structure of the power generation unit 100 according to the present embodiment is formed as a cantilever structure in which a beam 104 having a mass 106 disposed at the tip thereof is fixed to a base 102 on the base end side thereof, and the base 102 is preferably fixed within the power generation unit 100. On the surface of the beam 104 there is attached a piezoelectric element 108 formed using a piezoelectric material such as lead zirconium titanate (PZT), and on the surfaces of the piezoelectric element 108 there are disposed a first electrode 109a and a second electrode 109b each formed of a metal thin film respectively on the obverse side and the reverse side. The piezoelectric element 108, the first electrode 109a, and the second electrode 109b constitute a piezoelectric device. Although in the example shown in FIG. 1A, the piezoelectric element 108 is disposed on the upper surface side of the beam 104, it is also possible to dispose the piezoelectric element 108 on the lower surface side of the beam 104, or it is also possible to dispose the piezoelectric elements 108 on both of the upper surface side and the lower surface side of the beam 104. Since the piezoelectric element 108 deforms following the deformation of the beam 104, the beam 104 corresponds to the "deforming member" according to the invention.

Since the beam 104 is fixed to the base 102 at the base end side thereof, and has the mass 106 disposed on the tip side thereof, when a vibration or the like is applied to the beam 104, the tip of the beam 104 vibrates with a large amplitude as indicated by the outlined arrow in the drawing. As a result, a compressive force and a tensile force alternately act on the piezoelectric element 108 attached to the surface of the beam 104. Then, the piezoelectric element 108 generates positive and negative charges due to the piezoelectric effect, and the charges appear in the first electrode 109a and the second electrode 109b. Although the mass 106 is not essential, it is desirable to create imbalance in mass between the tip side and the base end side of the beam 104. This is because the displacement of the beam 104 becomes easy to repeat in response to one vibration, for example, due to the imbalance in mass.

Displacement detection switches 130a, 130b are fixed within the power generation unit 100, detect the displacement of the beam 104 as the deforming member, and correspond to displacement detection sections. Specifically, in the case (the case in which the upper surface side of the beam 104 has a concave shape) in which the beam 104 is warped upward beyond a predetermined level due to the vibration, a button 132a of the displacement detection switch 130a is pressed. Therefore, the displacement detection switch 130a can detect the upward displacement of the beam 104. On the other hand, in the case (the case in which the lower surface side of the beam 104 has a concave shape) in which the beam 104 is warped downward beyond a predetermined level due to the vibration, a button 132b of the displacement detection switch 130b is pressed. Therefore, the displacement detection switch 130b can detect the downward displacement of the beam 104.

In the present embodiment, the displacement detection switches 130a, 130b each having a mechanical contact are respectively installed so as to be opposed to the surface (the upper surface corresponding to a first surface) of the beam 104 on which the piezoelectric element 108 is disposed, and the surface (the lower surface) as a reverse side of the upper surface and provided with the mass 106.

Here, it is preferable for the displacement detection switches 130a, 130b to measure the displacement of the tip side of the beam 104 for accurate displacement detection. This is because the tip side of the beam 104 vibrates with a larger amplitude in response to application of a vibration compared to the base end side thereof Although the displacement detection switches 130a, 130b respectively correspond to, for example, the first displacement detection section and the second displacement detection section according to the invention, the correspondence relationship can be reversed. The displacement detection switches 130a, 130b can also be fixed to, for example, a housing (not shown) of the power generation unit 100 so as to be set to the conductive state if the level of the displacement of the beam 104 exceeds a predetermined level. It is also possible to arrange that the displacement detection switches 130a, 130b are fixed to the surfaces of the beam 104, and are set to the conductive state when, for example, the buttons have contact with the housing of the power generation unit 100 and are pressed by the housing.

FIG. 1B shows an example of a circuit diagram of the power generation unit 100 according to the present embodiment. The piezoelectric element 108 can electrically be expressed as a current source and a capacitor C0 for storing a charge. An inductor L is connected in parallel to the piezoelectric element 108 to thereby form an electrical resonant circuit together with the capacitive component (the capacitor C0) of the piezoelectric element 108. A switch SW for switching ON/OFF the resonant circuit is connected in series to the inductor L. A control circuit 112 (corresponding to a control section) controls ON/OFF of the switch SW. The first electrode 109a and the second electrode 109b provided to the piezoelectric element 108 are connected to a full bridge rectifier 120 composed of four diodes D1 through D4. Further, a capacitor (a capacitor C1) for storing the current, which has been rectified, for driving an electrical load is connected to the full bridge rectifier 120.

Here, by receiving signals representing whether or not the conductive state occurs from the displacement detection switch 130a (corresponding to the first displacement detection section) and the displacement detection switch 130b (corresponding to the second displacement detection section), the control circuit 112 can figure out the timing (i.e., the timing of switching of the displacement direction of the piezoelectric device) at which the beam 104 is displaced beyond a predetermined level, and the direction of the displacement is switched, as described later. Since the timing at which the switch SW is set to the ON state is accurately determined based on the signals from the displacement detection switches 130a, 130b, the step-up effect can be improved.

A-2. Operation of Power Generation Unit

Figure 2A:
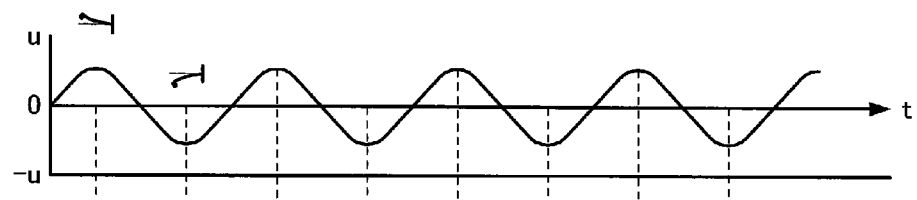
FIGS. 2A through 2D are explanatory diagrams showing an operation of the power generation unit according to the first embodiment.
Figure 2B:
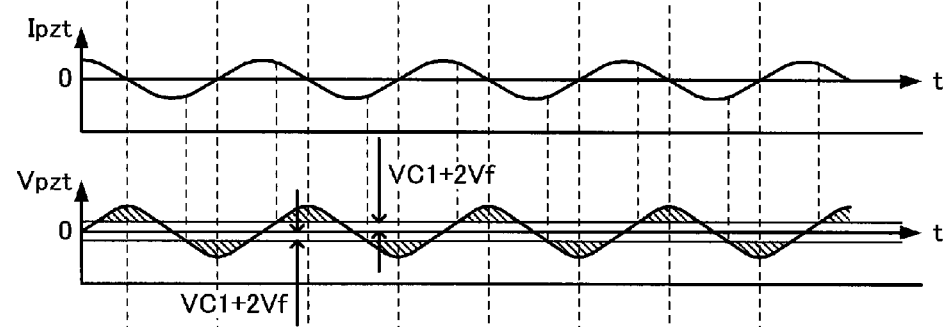

FIGS. 2A through 2D are explanatory diagrams showing the operation of the power generation unit 100 according to the present embodiment. FIG. 2A shows the displacement of the tip of the beam 104 due to the vibration of the beam 104. The positive displacement (u) represents the state (the state in which the upper surface of the beam 104 has a concave shape) in which the beam 104 is warped upward, and the negative displacement (−u) represents the state (the state in which the lower surface of the beam 104 has a concave shape) in which the beam 104 is warped downward. FIG. 2B shows the state of the current generated by the piezoelectric element 108 due to the deformation of the beam 104 and the electromotive force caused inside the piezoelectric element 108 as a result thereof. In FIG. 2B the state of the charge generated in the piezoelectric element 108 is expressed as an amount of the charge (i.e., a current Ipzt) generated per unit time, and the electromotive force generated in the piezoelectric element 108 is represented as the electrical potential difference Vpzt generated between the first electrode 109a and the second electrode 109b.

As shown in FIGS. 2A and 2B, during the period in which the displacement of the beam 104 keeps increasing, the piezoelectric element 108 generates a current in the positive direction (i.e., the current Ipzt takes a positive value), and the electrical potential difference Vpzt between the first electrode 109a and the second electrode 109b increases in the positive direction in conjunction therewith. If the electrical potential difference Vpzt in the positive direction exceeds the sum of the voltage VC1 of the capacitor C1 and a twofold of the forward voltage drop Vf of the diode constituting the full bridge rectifier 120, namely VC1+2 Vf, the charge generated thereafter can be taken out as a direct current and stored in the capacitor C1. During the period in which the displacement of the beam 104 keeps decreasing, the piezoelectric element 108 generates a current in the negative direction (i.e., the current Ipzt takes a negative value), and the electrical potential difference Vpzt between the first electrode 109a and the second electrode 109b increases in the negative direction in conjunction therewith. If the electrical potential difference Vpzt in the negative direction exceeds the sum of VC1 and 2 Vf of the full bridge rectifier 120, the charge generated can be taken out as a direct current and stored in the capacitor C1. In other words, even when keeping the switch SW shown in FIG. 1B in the OFF state, the charge can be stored in the capacitor C1 regarding the part indicated by hatching in FIG. 2B.

Figure 2C:
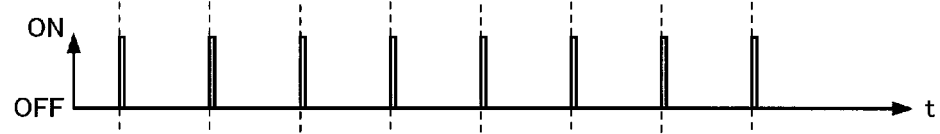
Figure 2D:
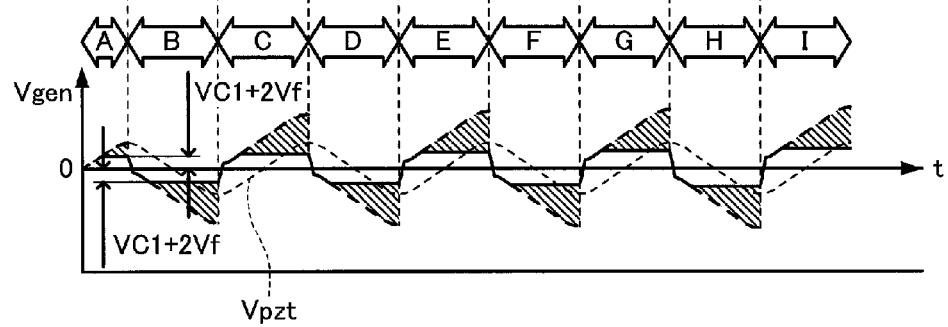

In the power generation unit 100 according to the present embodiment, the switch SW is set to the ON state at the timings shown in FIG. 2C. Then, as shown in FIG. 2D, there occurs a phenomenon in which the voltage waveform between the terminals (hereinafter described as "between the terminals of the piezoelectric element 108") of the piezoelectric device including the piezoelectric element 108 is changed as if it is shifted when the switch SW is set to the ON state. In other words, in the period B indicated as "B" in FIG. 2D, for example, a voltage waveform indicated by the thick dotted line, which is a voltage waveform changed as if the electrical potential difference Vpzt indicated by the thin dotted line corresponding to the electromotive force of the piezoelectric element 108 is shifted toward the negative side, appears between the terminals of the piezoelectric element 108. The reason that such a phenomenon occurs will be described later. In the period C indicated as "C" in FIG. 2D, there appears a voltage waveform indicated by the thick dotted line shaped as if the voltage waveform Vpzt corresponding to the electromotive force of the piezoelectric element 108 is shifted toward the positive side. Similarly, thereafter, in each of the period D, the period E, the period F, and so on, there appears a voltage waveform indicated by the thick dotted line shaped as if the voltage waveform Vpzt corresponding to the electromotive force of the piezoelectric element 108 is shifted toward the positive side or the negative side. In the part (the part indicated by hatching in FIG. 2D) where the voltage waveform thus shifted exceeds the sum of VC1 and 2 Vf, the charge generated in the piezoelectric element 108 can be stored in the capacitor C1. As a result of the flow of the charge from the piezoelectric element 108 to the capacitor C1, the voltage between the terminals of the piezoelectric element 108 is clipped at the voltage corresponding to the sum of VC1 and 2 Vf. As a result, the waveform indicated by the thick solid line in FIG. 2D is obtained as the voltage waveform of the voltage between the first electrode 109a and the second electrode 109b.

As is obvious from the comparison between the case of keeping the switch SW in the OFF state shown in FIG. 2B and the case of setting the switch SW to the ON state at the timing when the deformation direction of the beam 104 is switched as shown in FIG. 2D, in the power generation unit 100 according to the present embodiment, it becomes possible to efficiently store the charge in the capacitor C1 by setting the switch SW to the ON state at appropriate timings.

If the charge is stored in the capacitor C1 to thereby increase the inter-terminal voltage of the capacitor C1, the shift amount of the voltage waveform also increases in accordance therewith. For example, in comparison between the period B (the state in which no charge is stored in the capacitor C1) in FIG. 2D and the period H (the state in which the charge is stored a little bit in the capacitor C1) in FIG. 2D, the shift amount of the voltage waveform is larger in the period H. Similarly, in comparison between the period C and the period I in FIG. 2D, the shift amount of the voltage waveform is larger in the period I in which the charge stored in the capacitor C1 is increased. Although the reason why such a phenomenon occurs will be described later, as a result, in the power generation unit 100 according to the present embodiment, it becomes possible to store the voltage higher than the voltage Vpzt, which is generated between the first electrode 109a and the second electrode 109b by deforming the piezoelectric element 108, in the capacitor C1. As a result, it becomes unnecessary to provide an additional step-up circuit, and thus it becomes possible to obtain a small-sized and highly efficient power generation unit.

A-3. Operation Principle of Power Generation Unit

Figure 3A:
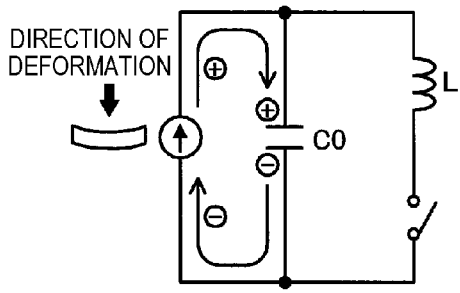
FIGS. 3A through 3F are explanatory diagrams conceptually showing an anterior half of the operation principle of the power generation unit according to the first embodiment.

FIGS. 3A through 3F are explanatory diagrams conceptually showing an anterior half of the operation principle of the power generation unit 100 according to the present embodiment. FIGS. 4A through 4F are explanatory diagrams conceptually showing a posterior half of the operation principle of the power generation unit 100 according to the present embodiment. FIGS. 3A through 3F conceptually show the movement of the charge in the capacitor C0 when setting the switch SW to the ON state in accordance with the deformation of the piezoelectric element 108. FIG. 3A shows the state in which the piezoelectric element 108 (the beam 104, to be precise) is deformed upward (so that the upper surface side has a concave shape). If the piezoelectric element 108 is deformed upward, the current in the positive direction flows from the current source, then the charge is stored in the capacitor C0, and the voltage in the positive direction is generated as the voltage Vgen. The voltage value increases as the deformation of the piezoelectric element 108 increases. The switch SW is set to the ON state at the timing (the timing at which the amount of the charge reaches the maximum value; see FIG. 3B) at which the deformation of the piezoelectric element 108 reaches the maximum value.

Figure 3F:
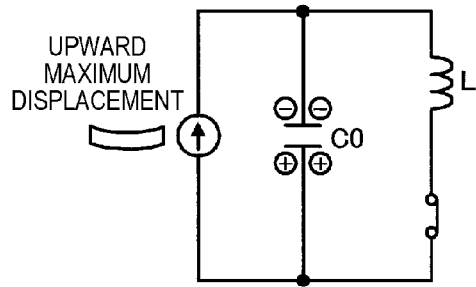
Figure 3B:
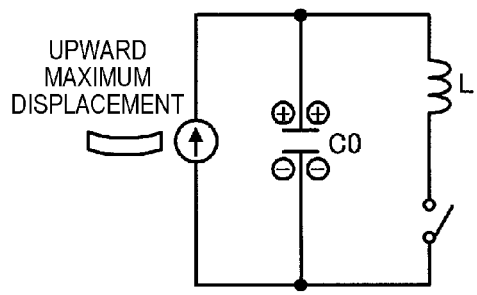
Figure 3E:
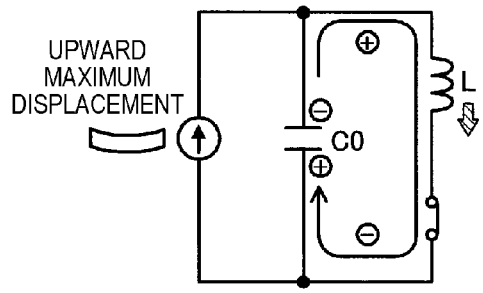
Figure 3C:
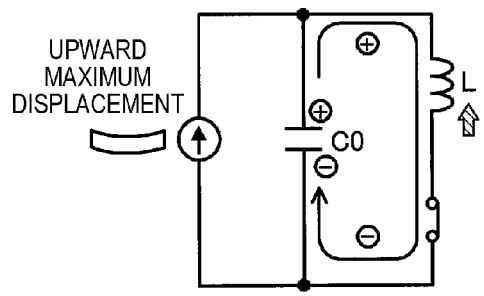

FIG. 3C shows the state immediately after setting the switch SW to the ON state. Since the charge is stored in the capacitor C0, the charge is urged to flow into the inductor L. Although a magnetic flux is generated (the magnetic flux increases) when a current flows through the inductor L, the inductor L has a nature (a self-induction effect) of generating a back electromotive force in the direction of preventing the change in the magnetic flux penetrating the inductor itself. Since the magnetic flux is urged to increase due to the charge flowing therethrough when the switch SW is set to the ON state, the back electromotive force occurs in the direction (in other words, the direction of hindering the flow of the charge) of preventing the magnetic flux from increasing. The level of the back electromotive force is proportional to the variation rate (the variation per unit time) of the magnetic flux. In FIG. 3C, the back electromotive force generated in the inductor L in such a manner as described above is indicated by the arrow provided with hatching. Since such a back electromotive force occurs, the charge in the piezoelectric element 108 flows out only gradually even when setting the switch SW to the ON state. In other words, the current flowing through the inductor L increases only gradually.

Figure 3D:
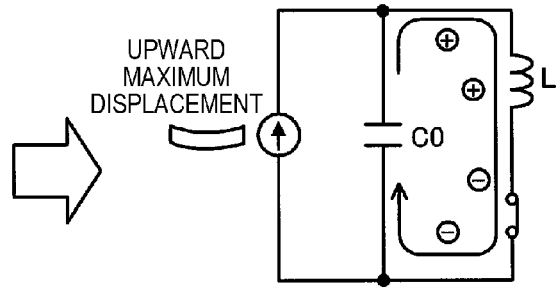

Subsequently, when the current flowing through the inductor L reaches a peak, the variation rate of the magnetic flux reaches "0," and therefore, the back electromotive force reaches "0" as shown in FIG. 3D. The current starts decreasing in turn. Then, since the magnetic flux penetrating the inductor L decreases, the electromotive force occurs in the inductor L in the direction (the direction of urging the current to flow) of preventing the decrease in the magnetic flux (see FIG. 3E). As a result, the current continues to flow through the inductor L while pulling out the charge from the capacitor C0 due to the electromotive force. If no loss occurs during the migration of the charge, all the charge generated by the deformation of the piezoelectric element 108 is migrated, and there occurs the state (i.e., the state in which the positive charge is distributed on the lower surface side of the piezoelectric element 108, and the negative charge is distributed on the upper surface side) looked as if the positive and negative charges are replaced with each other. FIG. 3F shows the state in which all the charge generated by the deformation of the piezoelectric element 108 has been migrated.

If the switch SW is kept in the ON state without change, a converse phenomenon to the content described above occurs in turn. Specifically, the positive charge on the lower surface side of the piezoelectric element 108 is urged to flow into the inductor L, and at this moment, the back electromotive force in the direction of hindering the flow of the charge occurs in the inductor L. Subsequently, when the current flowing through the inductor L reaches the peak and then takes a downward turn, the electromotive force in the direction (the direction of urging the current to continue to flow) of preventing the current from decreasing occurs in turn in the inductor L. As a result, there occurs the state (the state shown in FIG. 3B) in which all the positive charge once located on the lower surface side of the piezoelectric element 108 has been migrated to the upper surface side. In such a manner as described above, the positive charge having returned to the upper surface side of the piezoelectric element 108 is migrated again to the lower surface side in the manner described above with reference to FIGS. 3B through 3F.

As described above, if the switch SW is set to the ON state in the state in which the charge is stored in the capacitor C0 and is then kept in the ON state, there occurs a kind of resonant phenomenon in which the direction of the current is reversed alternately between the piezoelectric element 108 and the inductor L. The period of the resonant phenomenon corresponds to the resonance period T of the so-called LC resonant circuit, and is therefore obtained by the formula $T=2\pi(LC)^{0.5}$, assuming that the value (capacitance) of the capacitor C0 (the capacitive component) included in the piezoelectric element 108 is C, and the value (inductance) of the inductive component of the inductor L is L. Therefore, the period immediately after (the state shown in FIG. 3C) setting the switch SW to the ON state until the state shown in FIG. 3F occurs is obtained as T/2.

Figure 4A:
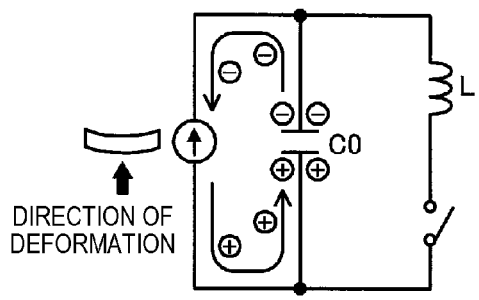
FIGS. 4A through 4F are explanatory diagrams conceptually showing a posterior half of the operation principle of the power generation unit according to the first embodiment.
Figure 4F:
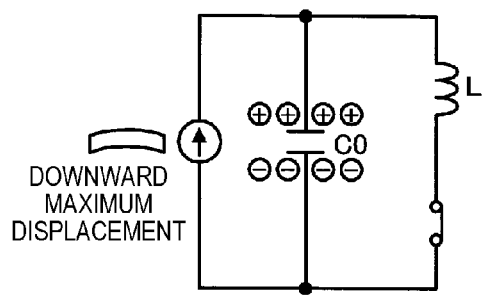
Figure 4B:
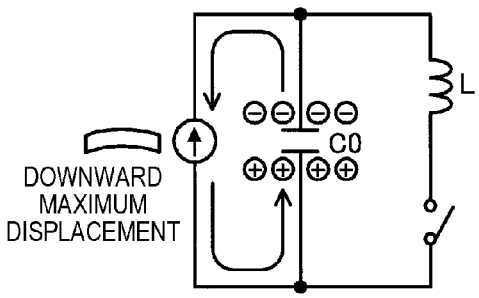
Figure 4E:
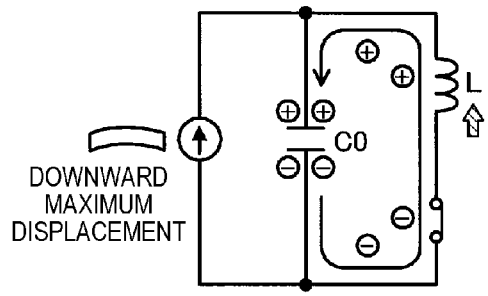
Figure 4C:
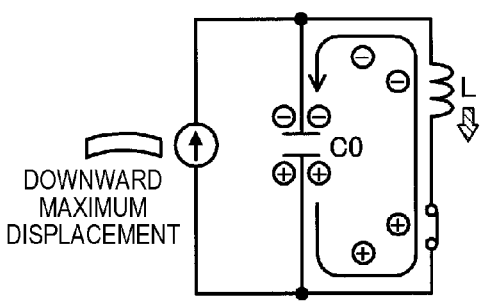
Figure 4D:
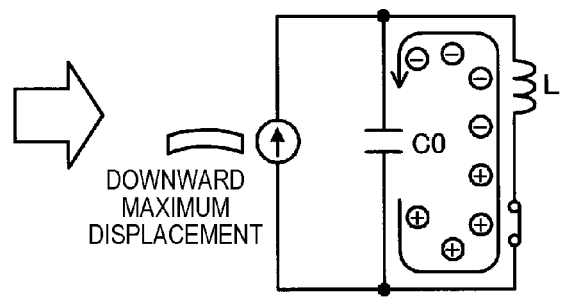

Therefore, the switch SW is set to the OFF state as shown in FIG. 4A at the time point when T/2 has elapsed after setting the switch SW to the ON state. The piezoelectric element 108 (the beam 104, to be precise) is in turn deformed downward (so that the lower surface side has a concave shape) in the present state. Although the piezoelectric element 108 is deformed upward in FIG. 3A described above, the piezoelectric element 108 is deformed downward in FIG. 4A, and therefore, the current flows from the current source in the negative direction, and the charge is stored in the capacitor CO so that the voltage Vgen increases toward the negative side. Since the positive charge is distributed on the lower surface side of the piezoelectric element 108 and the negative charge is distributed on the upper surface side in the stage prior to deforming the piezoelectric element 108 (the beam 104, to be precise) downward as described above with reference to FIGS. 3A through 3F, it results that a new positive charge is stored on the lower surface side and a new negative charge is stored on the upper surface side in addition to these charges. FIG. 4B shows the state in which the new charges are stored in the piezoelectric element 108 by deforming the piezoelectric element 108 (the beam 104, to be precise) in the state of setting the switch SW to the OFF state.

When setting the switch SW to the ON state in this state, the positive charge stored on the lower surface side of the piezoelectric element 108 is urged to flow into the inductor L. At this moment, since the back electromotive force occurs in the inductor L (see FIG. 4C), the current starts flowing gradually, and eventually reaches the peak, and then makes a downward turn. Then, the electromotive force occurs in the inductor L in the direction (the direction of urging the current to continue to flow) of preventing the current from decreasing (see FIG. 4E), and the current continues to flow due to the electromotive force. Eventually, there occurs the state in which all the positive charge once distributed on the lower surface side of the piezoelectric element 108 has been migrated to the upper surface side, and all the negative charge once distributed on the upper surface side thereof has been migrated to the lower surface side (see FIG. 4F). The time necessary for migrating all the positive charge on the lower surface side to the upper surface side and migrating all the negative charge on the upper surface side to the lower surface side is equal to the time T/2 corresponding to a half cycle of the LC resonant circuit. Therefore, by setting the switch SW to the OFF state when the time T/2 has elapsed after setting the switch SW to the ON state, and then deforming in turn the piezoelectric element 108 (the beam 104, to be precise) upward (so that the upper surface side has a concave shape), the positive and negative charges can further be stored in the piezoelectric element 108.

As explained hereinabove, in the power generation unit 100 according to the present embodiment, by deforming the piezoelectric element 108 to thereby generate the charges, and then connecting the piezoelectric element 108 to the inductor L to thereby form the resonant circuit for a half cycle of the resonance period, the distributions of the positive and negative charges in the piezoelectric element 108 are reversed. Subsequently, the piezoelectric element 108 is in turn deformed in the opposite direction to thereby generate new charges. Since the distributions of the positive and negative charges in the piezoelectric element 108 have been reversed, it results that the charges newly generated are stored in the piezoelectric element 108. Subsequently, the piezoelectric element 108 is connected again to the inductor L for a half cycle of the resonance period to thereby reverse the distributions of the positive and negative charges in the piezoelectric element 108, and then the piezoelectric element 108 is deformed in the opposite direction. By repeating such operations, it is possible to increase the charge stored in the piezoelectric element 108 every time the piezoelectric element 108 is deformed in a repeated manner.

Due to the resonance of the LC resonant circuit, by setting the switch SW to the OFF state at least when the polarity of the voltage Vgen is changed to the opposite polarity to the polarity thereof at the time point when the switch SW is set to the ON state, the voltage Vgen continues to rise. Although in the explanation described above (and the explanation hereinafter described) "T/2 (a half of the resonance period)" is adopted for the sake of convenience, the time is not limited thereto, but it is possible to efficiently raise the voltage Vgen by setting the predetermined period during which the switch SW is set to the ON state to the time at least longer than $(n+1/4)T$ and shorter than $(n+3/4)T$ (n denotes an arbitrary integer equal to or greater than 0) with respect to the resonance period T of the LC resonant circuit.

As described above with reference to FIGS. 2A through 2D, in the power generation unit 100 according to the present embodiment, the phenomenon of shifting the voltage waveform between the terminals of the piezoelectric element 108 occurs every time the switch SW is set to the ON state. Specifically, in the period A shown in FIG. 2D, for example, although the voltage is generated between the first electrode 109a and the second electrode 109b in accordance with the deformation of the piezoelectric element 108 (the beam 104, to be precise), since the first electrode 109a and the second electrode 109b are connected to the full bridge rectifier 120, the charge corresponding to the part exceeding the voltage of the sum of VC1 and 2 Vf flows into the capacitor C1 connected to the full bridge rectifier 120. As a result, when setting the switch SW to the ON state at the time point when the deformation of the beam 104 reaches the maximum value, the positive and negative charges remaining in the piezoelectric element 108 at that moment are migrated via the inductor L, and the locations of the positive and negative charges in the piezoelectric element 108 are replaced with each other. As is obvious from the mechanism described above with reference to FIGS. 3A through 3F and 4A through 4F, the period during which the switch SW is kept in the ON state corresponds to a half of the resonance period of the resonant circuit composed of the capacitor of the piezoelectric element 108 and the inductor L.

When deforming the beam 104 in the opposite direction in the state in which the locations of the positive and negative charges are replaced with each other, the voltage waveform due to the piezoelectric effect appears between the first electrode 109a and the second electrode 109b of the piezoelectric element 108. In other words, it results that the voltage change due to the deformation of the piezoelectric element 108 occurs in the state in which the polarities of the first electrode 109a and the second electrode 109b of the piezoelectric element 108 are replaced with each other. As a result, there appears in the period B shown in FIG. 2D the voltage waveform looked as if the voltage waveform generated in the piezoelectric element 108 due to the deformation of the beam 104 is shifted. However, as described above, since the charge corresponding to the part exceeding the voltage of the sum of VC1 and 2 Vf flows into the capacitor C1, the voltage between the first electrode 109a and the second electrode 109b of the piezoelectric element 108 is clipped at the voltage of the sum of VC1 and 2 Vf. Subsequently, when setting the switch SW to the ON state for the period half as long as the resonance period, the locations of the positive and negative charges remaining in the piezoelectric element 108 are replaced with each other. By the deformation of the beam 104 starting from that state, the voltage waveform due to the piezoelectric effect appears in the piezoelectric element 108. Therefore, it results that there appears also in the period C shown in FIG. 2D the voltage waveform looked as if the voltage waveform due to the deformation of the beam 104 is shifted.

As described above with reference to FIGS. 2A through 2D, in the power generation unit 100 according to the present embodiment, there also occurs the phenomenon that the shift amount of the voltage waveform gradually increases while the beam 104 repeats the deformation. Therefore, there can be obtained a significant advantage that the voltage higher than the electrical difference caused between the first electrode 109a and the second electrode 109b due to the piezoelectric effect of the piezoelectric element 108 can be stored in the capacitor C1. Such a phenomenon is caused by the following mechanism.

Firstly, as described in the period A or the period B in FIG. 2D, in the case in which the capacitor C1 has not been charged, since the charge flows from the piezoelectric element 108 into the capacitor C1 when the voltage generated between the terminals of the piezoelectric element 108 exceeds 2 Vf of the full bridge rectifier 120, the voltage appearing between the terminals of the piezoelectric element 108 is clipped at 2 Vf. However, as the capacitor C1 is charged in such a manner as described above, the voltage between the terminals of the capacitor C1 increases. Then, thereafter, the charge does not flow into the capacitor C1 from the piezoelectric element 108 until the inter-terminal voltage of the capacitor C1 reaches a voltage higher than the sum of VC1 and 2 Vf. Therefore, the value at which the voltage between the terminals of the piezoelectric element 108 is clipped gradually rises as the charge stored in the capacitor C1 increases.

In addition, as described above with reference to FIGS. 3A through 3F and 4A through 4F, on the condition that the charge is prevented from flowing out from the piezoelectric element 108, the charges in the piezoelectric element 108 continue to increase every time the piezoelectric element 108 (the beam 104, to be precise) is deformed, and the voltage between the terminals of the piezoelectric element 108 rises in conjunction therewith. Therefore, according to the power generation unit 100 of the present embodiment, it becomes possible to generate the electrical power in the condition in which the voltage is automatically raised to the voltage necessary to drive the electrical load without providing an additional step-up circuit.

A-4. Switching Timing of Switch

As described hereinabove, in the power generation unit 100 according to the present embodiment, by applying the cyclic deformation to the piezoelectric element 108 (the beam 104, to be precise), and connecting the piezoelectric element 108 to the inductor L for a period of time half as long as the resonance period when the deformation direction is switched, it is possible to obtain an excellent feature that it can easily be miniaturized because the efficiency is high, and in addition, no step-up circuit is required.

The timing at which the deformation direction of the beam 104 is switched coincides with the timing at which the displacement of the beam 104 takes a local maximum value or a local minimum value (hereinafter the local maximum value and the local minimum value are collectively referred to as an extreme value). Therefore, by adopting the configuration in which the displacement detection switch including a mechanical contact is used, and the displacement detection switch is set to the conductive state in the case in which the level of the displacement of the beam 104 exceeds a predetermined level, the timing at which the deformation direction of the beam 104 is switched can easily be obtained.

In the power generation unit 100 according to the present embodiment, the displacement detection switch is set to the conductive state in the case in which the level of the displacement of the beam 104 exceeds a predetermined level, and the control section does not perform the ON/OFF control of the switch SW of the resonant circuit until the control section makes sure of the conductive state. Therefore, in the case of controlling the switch SW of the resonant circuit, the power consumption is prevented from overtaking the power generation amount, and the efficient power generation unit 100 can be realized.

Figure 5A:
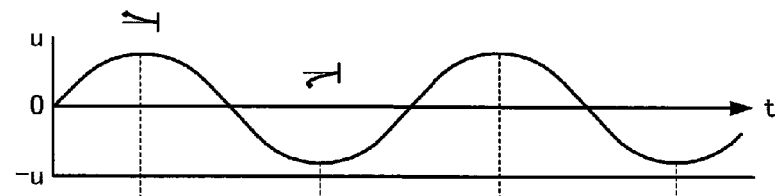
Figure 5B:
Figure 5C:
Figure 5C:
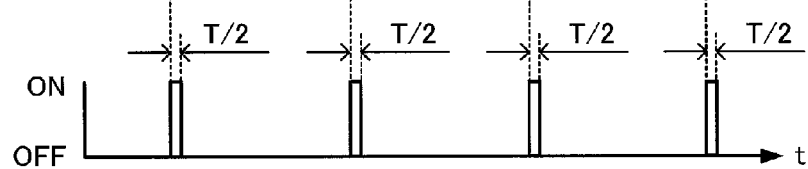

FIGS. 5A through 5D are explanatory diagrams showing the reason that the switch SW can be controlled at appropriate timings by detecting the displacement of the beam 104 in vibration with the displacement detection switches 130a, 130b. FIG. 5A shows the displacement of the beam 104. FIGS. 5B and 5C respectively show the ON/OFF states of the displacement detection switches 130a, 130b, which are set to the ON state in the case in which the level of the displacement is equal to or higher than a predetermined level. In this example, the predetermined level is assumed to be a value slightly smaller than the amplitude of the vibration of the beam 104.

As described above with reference to FIGS. 3A through 3F and 4A through 4F, the electrical power can be generated with the highest efficiency in the case of setting the switch SW to the ON state at the timing at which the displacement of the beam 104 reaches the extreme value. The displacement detection switches 130a, 130b are disposed at appropriate positions in the power generation unit 100, and are set to the ON state when the tip portion of the beam 104 presses the buttons of the respective displacement detection switches. As shown in FIGS. 5A and 5B, in the present example, the displacement detection switch 130a is set to the ON state in the case in which the displacement of the beam 104 is in an upward direction and exceeds a predetermined level. As shown in FIGS. 5A and 5C, the displacement detection switch 130b is set to the ON state in the case in which the displacement of the beam 104 is in an downward direction and exceeds a predetermined level.

As shown in FIG. 5D, the control circuit 112 receives the signals representing the ON/OFF states of the displacement detection switches 130a, 130b, and sets the switch SW to the ON state for a period (T/2) half as long as the resonance period described above started from the timing at which either one of the displacement detection switches 130a, 130b is set to the ON state, and thus, it becomes possible to efficiently generate the electrical power.

On this occasion, since the beam 104 vibrates in response to the external force, the magnitude (the amplitude) of the displacement of the vibration is diverse. However, in the present embodiment, the displacement detection switches 130a, 130b are not set to the ON state if the vibration does not have an amplitude equal to or greater than a predetermined level. Therefore, in the case of controlling the switch SW of the resonant circuit, the power consumption is prevented from overtaking the power generation amount, and the efficient power generation unit 100 can be realized.

Figure 6:
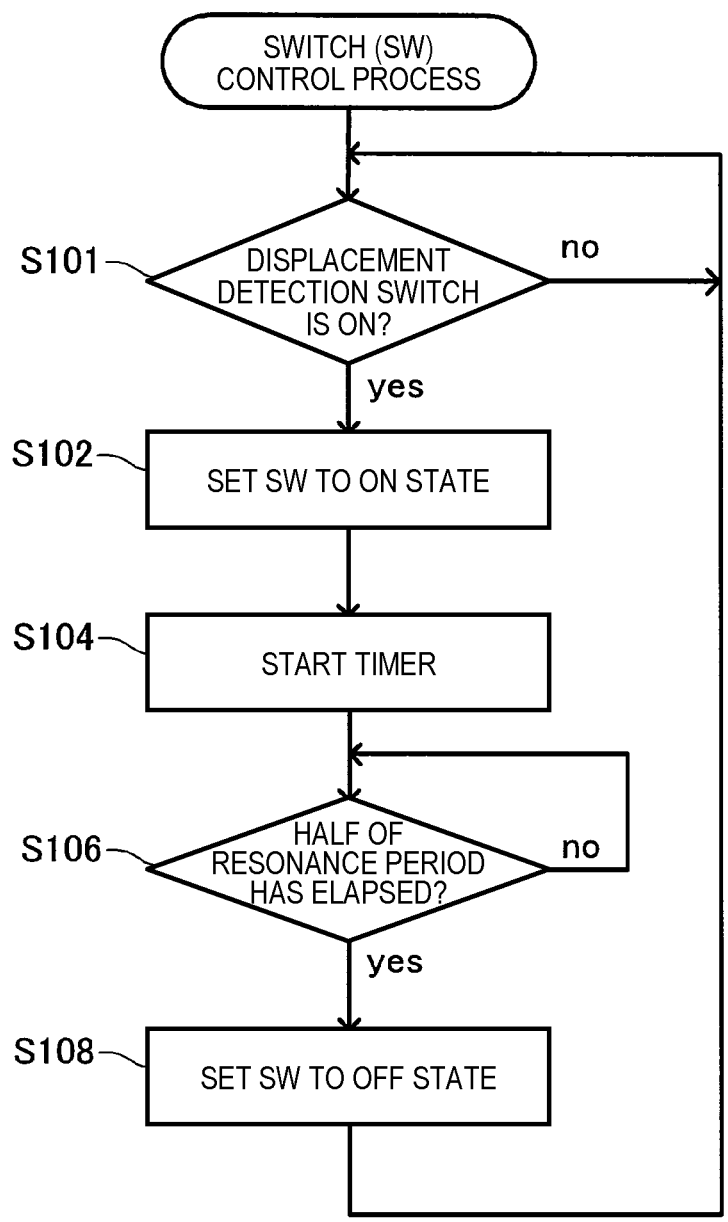
FIG. 6 is a flowchart showing a switch control process of switching between the ON and OFF states of the switch SW.

FIG. 6 is a flowchart showing a switch control process of switching between the ON and OFF states of the switch SW. This process is performed using a CPU not shown incorporated in, for example, the control circuit 112. Although the description of "switch (SW) control process" is used in FIG.

6, this is for preventing the misunderstanding of the "switch" with the displacement detection switch, and the process will hereinafter be described simply as the "switch control process."

When the switch control process is started, the CPU of the control circuit 112 determines (step S101) whether or not the displacement detection switch 130a, 130b is in the ON state (corresponding to the conductive state). For example, the CPU of the control circuit 112 can receive a digital signal taking the high/low levels in accordance with the ON/OFF states of the displacement detection switch 130a. The same is also applied to the displacement detection switch 130b. Here, the high level denotes a high electrical potential such as VDD, and the low level denotes a low electrical potential such as GND. Here, the fact that either one of the displacement detection switches 130a, 130b is in the ON state as described above means that the displacement of the beam 104 is at the peak (the extreme value).

If the peak of the displacement of the beam 104 is detected (yes in the step S101), the CPU of the control circuit 112 sets (step S102) the switch SW of the resonant circuit (the resonant circuit composed of the capacitor CO of the piezoelectric element 108 and the inductor L) to the ON state, and then starts (step S104) a timer not shown incorporated in the control circuit 112. Whether or not the time half as long as the resonance period of the resonant circuit composed of the capacitor CO of the piezoelectric element 108 and the inductor L has elapsed is determined (step S106). If the peak of the displacement of the beam 104 is not detected (no in the step S101), the CPU waits until either one of the displacement switches 130a, 130b is set to the ON state.

As a result, if it is determined that the period half as long as the resonance period has not yet elapsed (no in the step S106), the same determination is repeatedly performed to thereby continue the standby state until the period half as long as the resonance period elapses. If it is determined that the period half as long as the resonance period has elapsed (yes in the step S106), the switch SW of the resonant circuit is set to the OFF state (step S108). Subsequently, the process returns to the top of the switch control process, and the series of processes described above are repeated.

By performing the ON/OFF control of the switch SW of the resonant circuit in such a manner as described hereinabove, the switch SW can easily be switched between the ON/OFF states at appropriate timings in accordance with the movement of the beam 104, and therefore, it becomes possible to efficiently generate the electrical power using the power generation unit 100.

A-5. Displacement Detection Switch

In the present embodiment, the displacement detection switches 130a, 130b are mechanical switches (switches including a mechanical contact) respectively provided with the buttons 132a, 132b, which set the displacement detection switches 130a, 130b to the ON state when being pressed. In other words, the displacement detection switches 130a, 130b are each a switch including a contact-type contact. Although in the present embodiment, the displacement detection switches 130a, 130b are set to the ON state when the buttons are pressed, there can also be adopted a normally-on switch changed to the OFF state. The displacement detection switch according to the invention is not limited to a specific type providing the switch includes a mechanical contact.

Figure 7A:
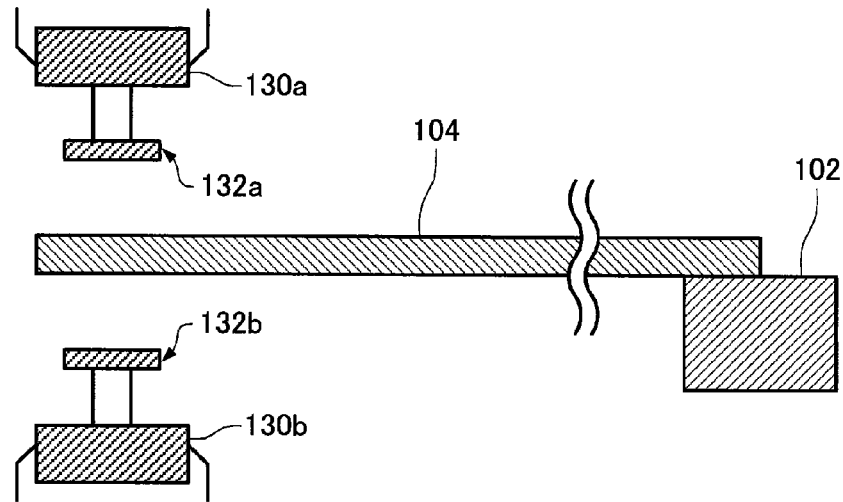
FIG. 7A is an explanatory diagram of a displacement detection switch.
Figure 7B:
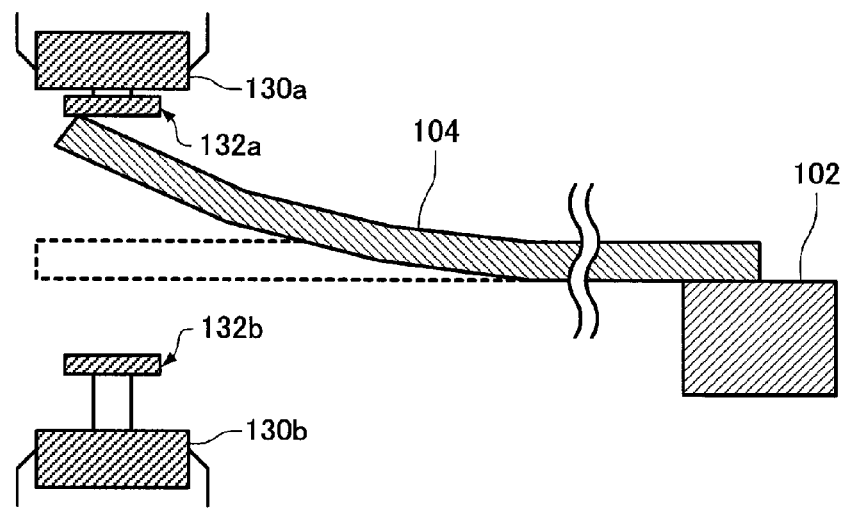
FIG. 7B is an explanatory diagram of the displacement detection switch.
Figure 7C:
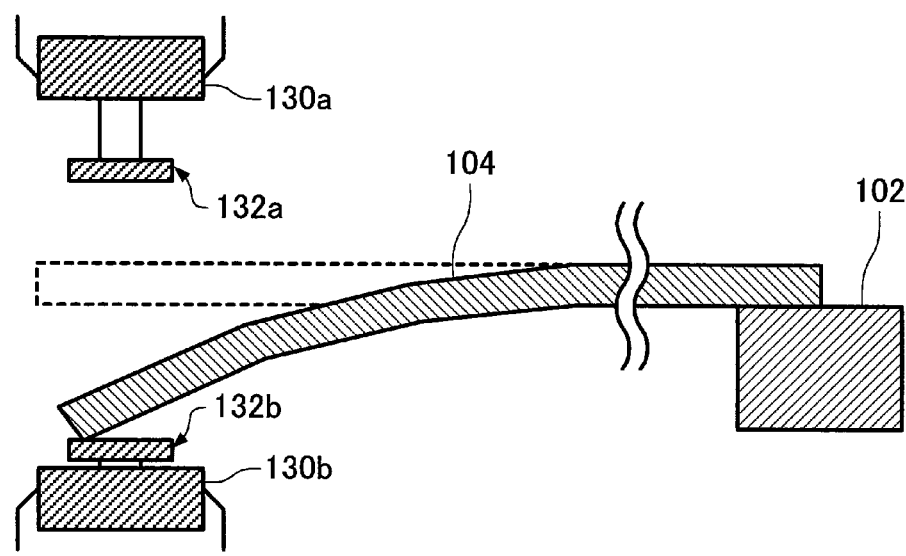
FIG. 7C is an explanatory diagram of the displacement detection switch.

FIGS. 7A through 7C are explanatory diagrams of the displacement detection switch of the present embodiment. FIGS. 7A through 7C correspond to a cross-sectional view of the power generation unit 100 shown in FIG. 1A cut along the longitudinal direction of the beam 104. It should be noted that the descriptions of the piezoelectric element 108, the first electrode 109a, the second electrode 109b, and the mass 106 are omitted. The same constituents as those shown in FIGS. 1A, 1B, 2A through 2D, 3A through 3F, 4A through 4F, 5A through 5D, and 6 are denoted with the same reference numerals, and the explanation therefor will be omitted.

FIG. 7A shows the case in which the displacement detection switches 130a, 130b are both in the OFF state. In the case in which the beam 104 does not vibrate, or the case in which the level of the displacement of the beam 104 is lower than a predetermined level, and therefore, the beam 104 fails to press the buttons 132a, 132b, the displacement detection switches 130a, 130b are both in the OFF state. This state corresponds to the state in which, for example, the displacement detection switches 130a, 130b are both in the OFF state in FIGS. 5B and 5C.

In this example, the displacement detection switches 130a, 130b are installed in the housing of the power generation unit 100 not shown so that the buttons 132a, 132b face to the beam 104 side. The distance from the beam 104 is adjusted so that the displacement detection switches 130a, 130b are set to the ON state at the extreme values of the vibration (e.g., the vibration with the characteristic frequency) of the beam 104. In other words, the "predetermined level" described above can be adjusted with the installation positions of the displacement detection switches 130a, 130b. For example, the length of the shaft of each of the buttons 132a, 132b can also be adjustable. In this case, fine adjustment of the distance from the beam 104 can be performed.

FIGS. 7B and 7C are diagrams showing the state in which the displacement detection switch 130a is set to the ON state, and the state in which the displacement detection switch 130b is set to the ON state, respectively. The beam 104 is warped upward and downward in a predetermined degree or more, and the buttons 132a, 132b are depressed, respectively. For example, the state shown in FIG. 7B corresponds to the state in which the displacement detection switch 130a is in the ON state in FIG. 5B. The state shown in FIG. 7C corresponds to the state in which the displacement detection switch 130b is in the ON state in FIG. 5C. In the case in which the beam 104 vibrates with a large amplitude, the ON/OFF state of the displacement detection switches 130a, 130b changes in the sequence of FIG. 7B, FIG. 7A, FIG. 7C, FIG. 7A, FIG. 7B, FIG. 7A, . . . .

In the present embodiment, the displacement detection switches 130a, 130b are installed in the housing of the power generation unit 100 not shown. However, by contraries, it is also possible to adopt the configuration in which the displacement detection switches 130a, 130b are installed in the beam 104, and the housing not shown depresses the buttons 132a, 132b due to the vibration of the beam 104. In this case, since it becomes possible to attach the displacement detection switch in the manufacturing process of the beam 104 as a component without assembling the whole of the power generation unit, the manufacturing process can be simplified.

As described above, the power generation unit according to the present embodiment can directly detect the displacement of the deforming member based on the ON/OFF states of the displacement detection switches. On this occasion, in order to figure out of the switching of the displacement direction of the deforming member, it is not required to, for example, calculate the variation in the current using the calculation process. Therefore, it is possible to suppress the growth in circuit size. The control section sets the switch provided to the resonant circuit to the conductive state for a predetermined period (e.g., a half of the resonance period) from the timing at which the displacement detection switch is switched to the ON state, for example, to thereby make it possible to efficiently store the charge in the piezoelectric device. Therefore, in the small-sized power generation unit using the piezoelectric effect, it is possible to efficiently generate a high voltage.

B. FIRST MODIFIED EXAMPLE

There exist a variety of modified examples in the present embodiment described above. A first modified example will hereinafter be explained with reference to FIGS. 8A, 8B, and 9.

In the power generation unit according to the embodiment described above, there are included the two displacement detection switches for switching between the ON/OFF states (conductive state/nonconductive state) in accordance with the displacement of the surfaces of the deforming member different from each other. Therefore, either one of the two displacement detection switches is set to the ON state at the timing at which the displacement direction of the deforming member is switched, and thus the timing for setting the switch provided to the resonant circuit to the conductive state can easily be obtained. In other words, the peak of every half cycle of the vibration of the deforming member can be figured out based on the timings at which the two displacement detection switches are respectively set to the ON state.

However, depending on the size of the displacement detection switch, there is a case in which the whole of the power generation unit can further be miniaturized by eliminating one of the displacement detection switches even if the computing circuit for calculating the timing at which the displacement direction of the deforming member is switched is added. Hereinafter, the first modified example including only a single displacement detection switch will be explained. The constituents substantially the same as those of the embodiment described above will be attached with the same reference numerals in the modified examples, and the detailed explanation therefor will be omitted.

Figure 8A:
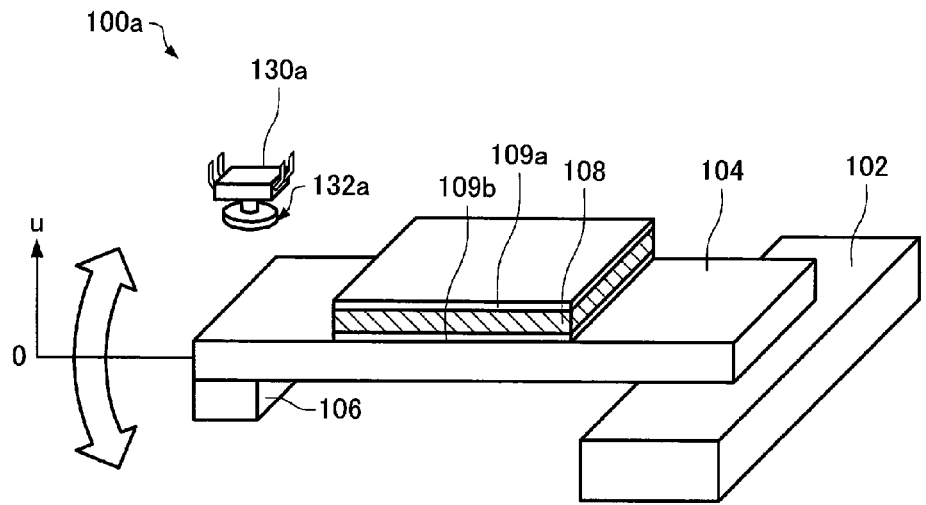
FIG. 8A is an explanatory diagram showing a structure of a power generation unit according to a first modified example.
Figure 8B:
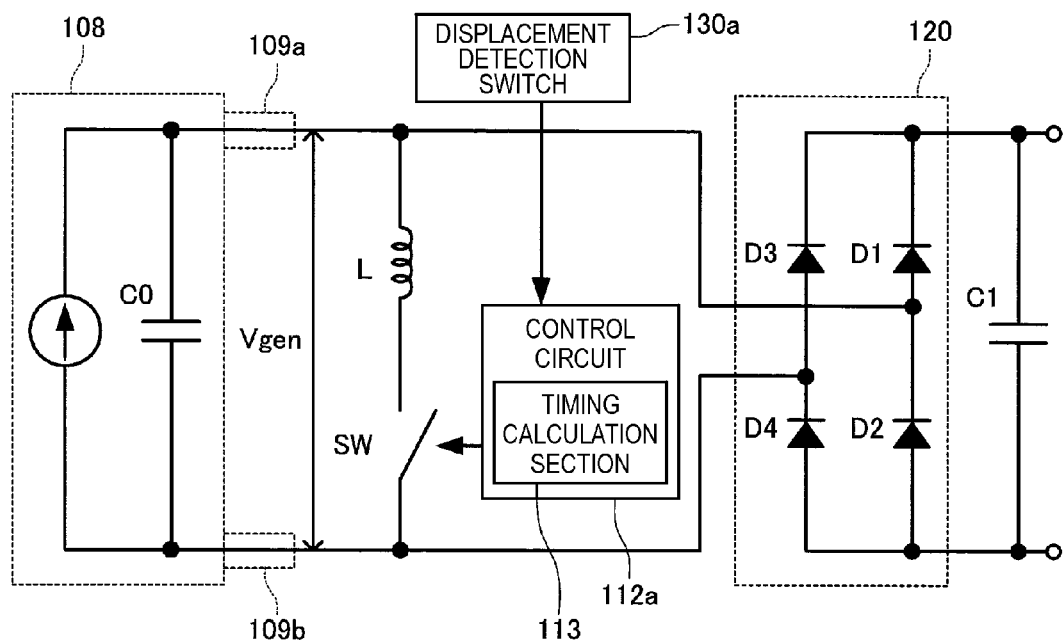
FIG. 8B is an explanatory diagram showing the structure of the power generation unit according to the first modified example.

FIGS. 8A and 8B are explanatory diagrams showing the power generation unit 100a according to the first modified example. FIG. 8A shows a mechanical structure of the power generation unit 100a, and corresponds to FIG. 1A in the embodiment described above. FIG. 8B shows an electrical structure, and corresponds to FIG. 1B in the embodiment described above.

As shown in FIGS. 8A and 8B, the power generation unit 100a includes one of the displacement detection switches, namely only the displacement detection switch 130a. The displacement detection switch 130a in the present modified example is the same as the displacement detection switch 130a on the embodiment described above, and in the case (the case in which the upper surface side of the beam 104 has a concave shape) in which the beam 104 is warped upward beyond a predetermined level due to the vibration, the button 132a of the displacement detection switch 130a is pressed. Therefore, a control circuit 112a in FIG. 8B can only figure out the peak of every cycle of the vibration of the deforming member. In other words, the control circuit 112a can figure out only the change shown in FIG. 5B, for example, but not receive the timings of the downward peaks shown in FIG. 5C. However, in order to realize the highly efficient power generation unit, it is required for the control circuit 112a to accurately set the switch SW to the ON state at the peak of every half cycle as shown in FIG. 5D.

Therefore, in the present modified example, as shown in FIG. 8B, the control circuit 112a includes a timing calculation section 113 for generating the timing corresponding to the peak of every half cycle by calculation to thereby realize the highly efficient power generation unit. In the present modified example, by receiving a signal representing whether or not (ON/OFF) the displacement detection switch 130a is in the conductive state, the control circuit 112a can figure out the timing at which the upward displacement of the beam 104 is switched to the downward displacement. However, it is not achievable to obtain the timing at which the downward displacement of the beam 104 is switched to the upward displacement. Therefore, the calculation is performed in the timing calculation section 113 to thereby generate the timings corresponding to the downward peaks of the beam 104.

Figure 9A:
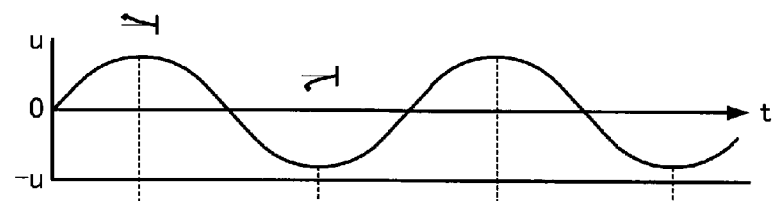
FIGS. 9A through 9D are explanatory diagrams of a timing calculation section of the first modified example.
Figure 9B:
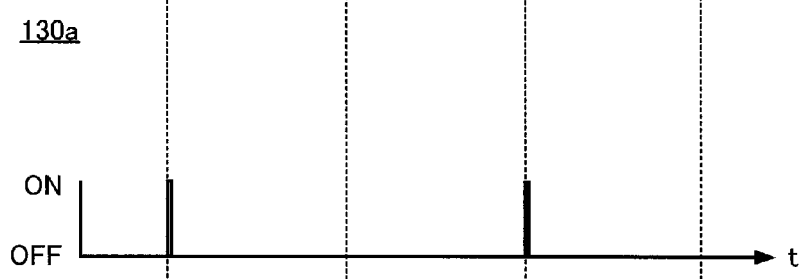
Figure 9C:
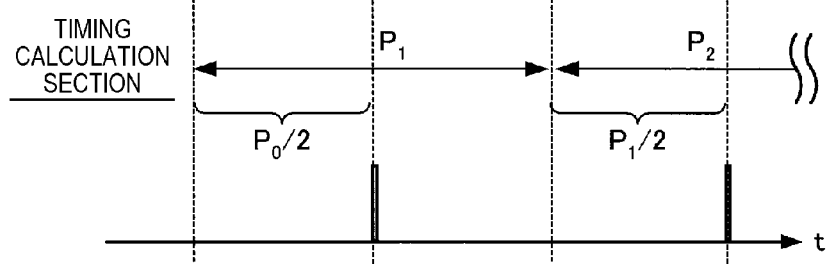
Figure 9D:
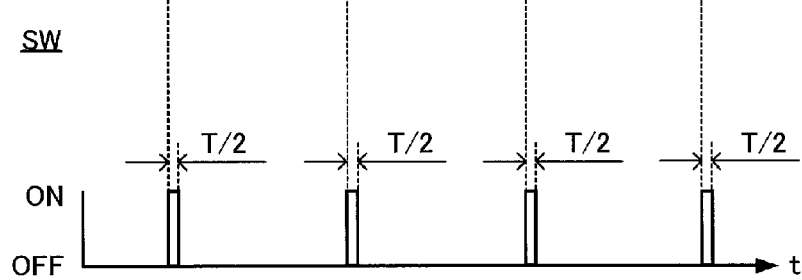

FIGS. 9A through 9D are explanatory diagrams of the timing calculation section 113 of the present modified example. FIGS. 9A, 9B, and 9D are the same as FIGS. 5A, 5B, and 5D, respectively, and the explanation therefor will be omitted. In the present modified example, the timing calculation section 113 generates pulse signals at the timings as shown in FIG. 9C to thereby make it possible to set the switch SW to the ON state at the peak of every half cycle as shown in FIG. 9D.

The timing calculation section 113 stores the period of time from when the displacement detection switch 130a is set to the ON state until next time it is set to the ON state. The time intervals are defined as P0, P1, P2, . . . . Although the time interval P1 is shown alone in FIG. 9C, it is assumed that the time intervals P0, P2 have been obtained similarly. Here, the time intervals P0, P1, P2, . . . indicate one cycle of the vibration of the deforming member. The timing calculation section 113 generates the pulse signal when a half of the time interval obtained last (P0/2 and P1/2 in FIG. 9C) has elapsed from when the displacement detection switch 130a is set to the ON state. The generation timing of the pulse signal is the timing at which a half cycle of the vibration of the deformation member has elapsed from when the displacement detection switch 130a is set to the ON state. In other words, the generation timing of the pulse signal corresponds to the timing at which the displacement detection switch 130b in the embodiment is set to the ON state (see FIG. 5C). As shown in FIG. 9D, if the control circuit 112a sets the switch SW to the ON state for the period (T/2) half as long as the resonance period described above from the timing at which the displacement detection switch 130a is set to the ON state and the timing at which the timing calculation section 113 generates the pulse signal, it becomes possible to efficiently generate the electrical power. In the present modified example, there is a possibility of further miniaturizing the power generation unit by reducing the number of displacement detection switches to one while performing the efficient power generation similarly to the embodiment described above.

C. SECOND MODIFIED EXAMPLE

A second modified example will hereinafter be explained with reference to FIGS. 10A through 10C. In the power generation unit according to the embodiment described above, if the deforming member is excessively deformed due to, for example, an external force, a strong impact propagates to the housing of the power generation unit via the displacement detection switches, and there is a possibility of causing a partial destruction or deformation. In the present modified example, since an elastic member included in the displacement detection switch absorbs the impact in the collision, it becomes possible to protect the power generation unit from the destruction, the deformation, and so on. The constituents substantially the same as those of the embodiment and the first modified example described above will be attached with the same reference numerals in the present modified example, and the detailed explanation therefor will be omitted.

Figure 10A:
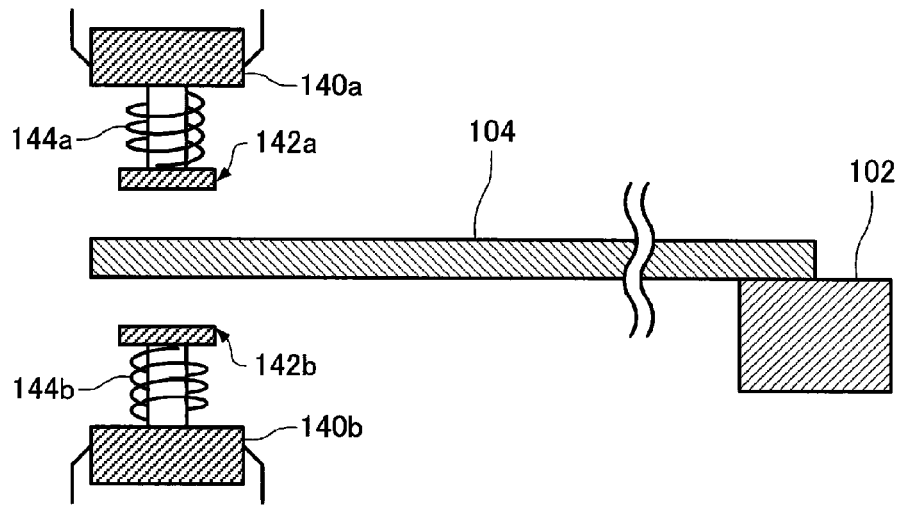
FIG. 10A is an explanatory diagram of a displacement detection switch of a second modified example including an elastic member.
Figure 10B:
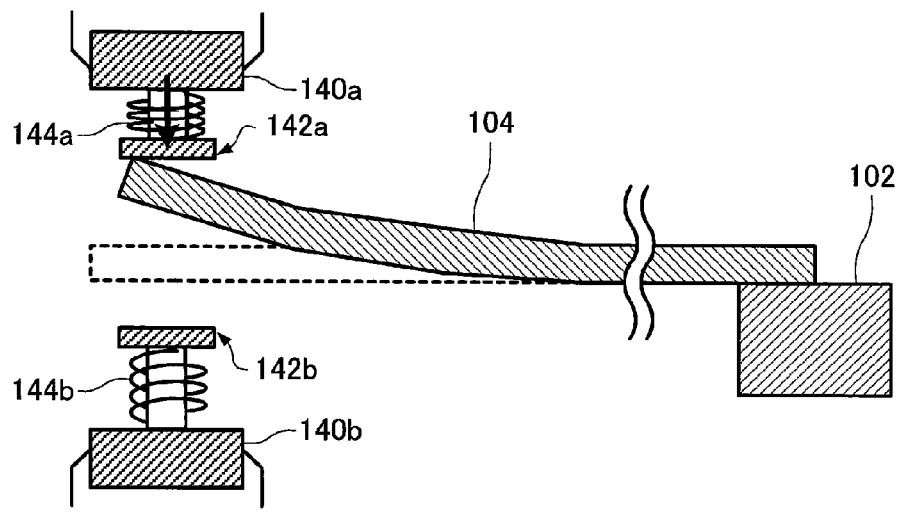
FIG. 10B is an explanatory diagram of the displacement detection switch of the second modified example including the elastic member.
Figure 10C:
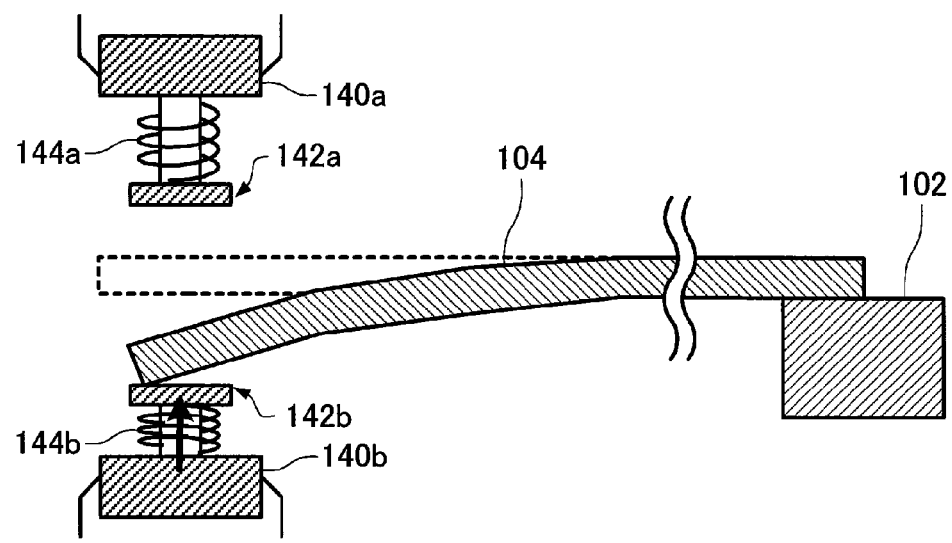
FIG. 10C is an explanatory diagram of the displacement detection switch of the second modified example including the elastic member.

FIGS. 10A through 10C are explanatory diagrams of a displacement detection switch of the present modified example including the elastic member. FIGS. 10A, 10B, and 10C correspond to FIGS. 7A, 7B, and 7C of the embodiment described above, respectively. In other words, FIG. 10A shows the case in which the displacement detection switches 140a, 140b are both in the OFF state. FIGS. 10B and 10C are diagrams showing the state in which the displacement detection switch 140a is set to the ON state, and the state in which the displacement detection switch 140b is set to the ON state, respectively.

Here, the displacement detection switches 140a, 140b are respectively provided with the buttons 142a, 142b, but further include elastic members 144a, 144b, respectively, unlike the embodiment described above. Although the elastic members 144a, 144b are each a spring in the present example, any member for absorbing the impact in the collision can also be adopted besides the spring.

In FIG. 10B, the beam 104 is warped upward beyond a predetermined level, and the button 142a is depressed to thereby set the displacement detection switch 140a to the ON state. On this occasion, the elastic member 144a (the spring) is contracted, and the force acts as indicated by the arrow in FIG. 10B. Since the force acts, even in the case in which the beam is deformed excessively, the impact in the collision can be absorbed. In FIG. 10C, the beam 104 is warped downward beyond a predetermined level, and the button 142b is depressed to thereby set the displacement detection switch 140b to the ON state. Also on this occasion, since the force indicated by the arrow in FIG. 10C acts, the impact in the collision can be absorbed.

As described above, in the present modified example, since the displacement detection switches 140a, 140b include the elastic members 144a, 144b to thereby absorb the impact in the collision, the power generating unit can be protected from the destruction and deformation.

D. Second Embodiment

D-1. Structure of Power Generation Unit

Figure 11A:
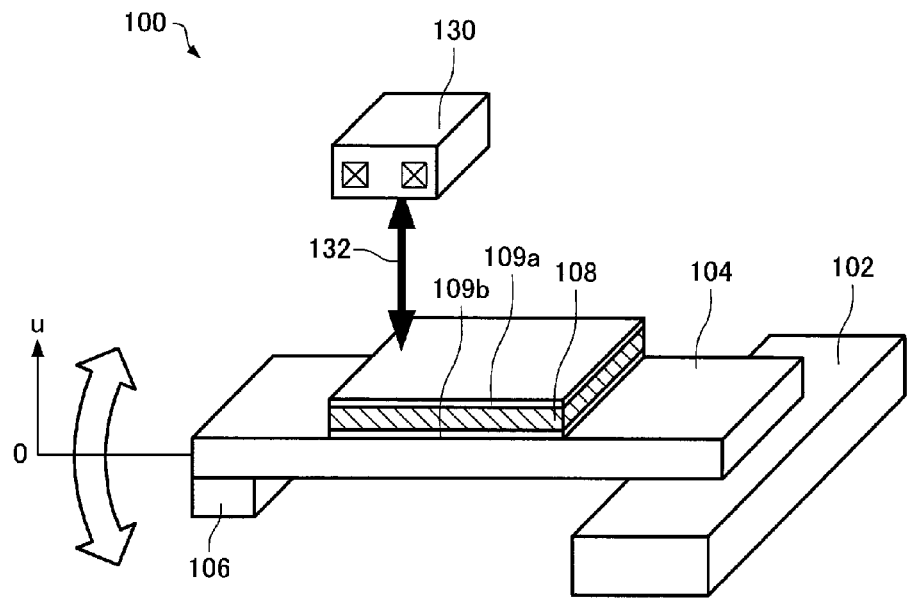
FIG. 11A is an explanatory diagram showing a structure of a power generation unit according to a second embodiment of the invention.
Figure 11B:
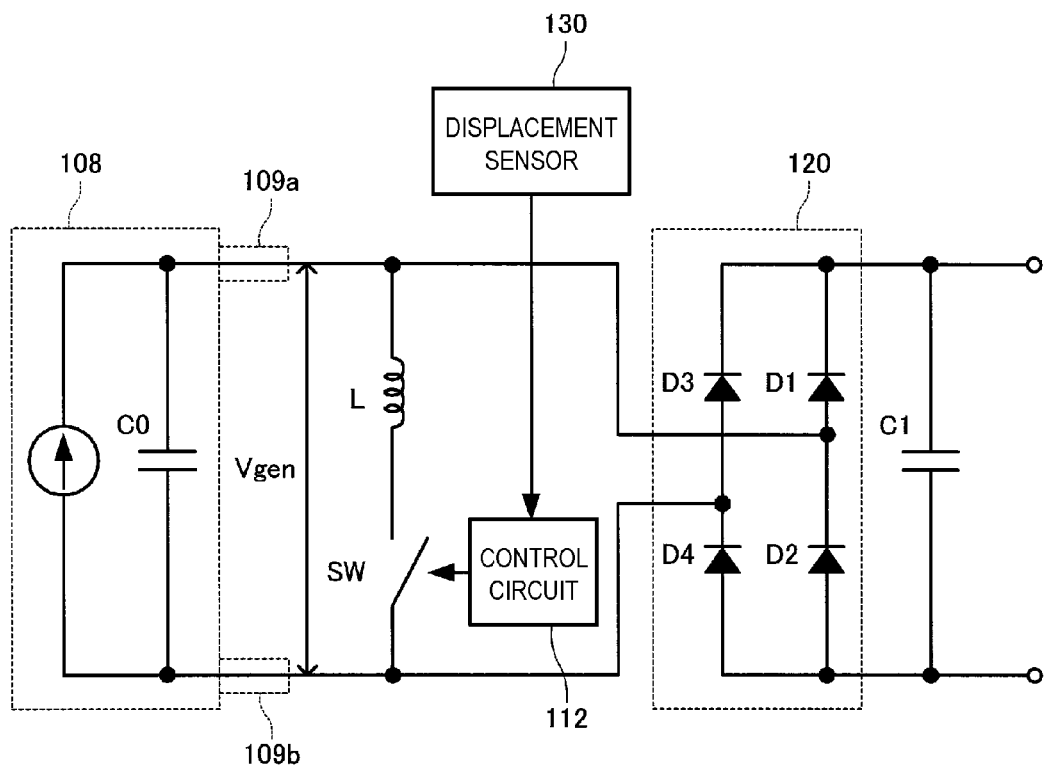
FIG. 11B is an explanatory diagram showing the structure of the power generation unit according to the second embodiment.

FIGS. 11A and 11B are explanatory diagrams showing a structure of a power generation unit 100 according to the present embodiment. FIG. 11A shows a mechanical structure of the power generation unit 100, and FIG. 11B shows an electrical structure thereof. In the present embodiment, a sensor (specifically a displacement sensor for measuring the displacement) is used as the displacement detection section unlike the first embodiment. The same constituents as those shown in FIGS. 1A, 1B, 2A through 2D, 3A through 3F, 4A through 4F, 5A through 5D, 6, 7A through 7C, 8A, 8B, 9A through 9D, and 10A through 10C are denoted with the same reference numerals, and the explanation therefor will be omitted. The displacement sensor 130 is a displacement detection section fixed within the power generation unit 100, and for measuring the displacement of the beam 104 as the deforming member. The displacement sensor 130 is preferably a contactless sensor, which does not hinder the deformation of the piezoelectric element 108, as is the case of the present embodiment. The detailed explanation of the contactless sensor will be described later.

In the present embodiment, the displacement sensor 130, which is a contactless sensor, is disposed so as to be opposed to the surface (the upper surface) of the beam 104 on which the piezoelectric element 108 is disposed. The displacement sensor 130 measures the distance 132 between a measurement position in the upper surface of the beam 104 and the displacement sensor 130.

It is preferable for the displacement sensor 130 to measure the displacement of the tip side of the beam 104 for accurate displacement detection. This is because the tip side of the beam 104 vibrates with a larger amplitude in response to application of a vibration compared to the base end side thereof. On the other hand, there is a possibility that there occurs the different in vibration between the part to which the piezoelectric element 108 is attached and the other part in the upper surface of the beam 104. Therefore, in order for figuring out the deformation of the piezoelectric element 108, it is preferable to measure the displacement of the part to which the piezoelectric element 108 is attached. Therefore, the displacement sensor 130 in the present embodiment is disposed so as to be opposed to the upper surface of the beam 104, and measures the distance 132 from the part corresponding to the tip side of the beam 104 within the part to which the piezoelectric element 108 is attached.

The displacement sensor 130 can also be disposed so as to be opposed to the lower surface of the beam 104. However, in this case, if it is attempt to measure the tip side of the beam 104, the mass 106 with a larger thickness may intervene or fail to intervene between the displacement sensor 130 and the beam 104, and thus, the accurate measurement might be hindered. Therefore, if the displacement sensor 130 is disposed so as to be opposed to the lower surface of the beam 104, there occurs the possibility that the measurement must be performed while avoiding the tip portion of the beam 104. Therefore, it is preferable that the displacement sensor 130 is disposed so as to be opposed to the upper surface of the beam 104.

Although the explanation is presented assuming that the distance 132 is measured by the displacement sensor 130 at the measurement position of the upper surface of the beam 104, it is also possible to provide an object displacement of which can be measured to the beam 104, and measure the displacement of the object, or it is also possible to use a side surface and so on of the beam 104 depending on the installation condition of the power generation unit 100 and the type of the displacement sensor.

FIG. 11B shows an example of a circuit diagram of the power generation unit 100 according to the present embodiment. The control circuit 112 determines the timing at which the switch SW is to be set to the ON state based on the information of the displacement of the beam 104 from the displacement sensor 130. Therefore, as described later, it is possible to accurately capture the timing at which the deformation direction of the piezoelectric device is switched to thereby enhance the step-up effect. Other constituents in the circuit diagram are the same as those in the first embodiment, and the explanation therefor will be omitted.

D-2. Switching Timing of Switch

As explained in the first embodiment section, by applying the cyclic deformation to the piezoelectric element 108 (the beam 104, to be precise), and connecting the piezoelectric element 108 to the inductor L for a period of time half as long as the resonance period when the deformation direction is switched, it is possible to realize the power generation unit which can easily be miniaturized because the efficiency is high, and in addition, no step-up circuit is required. Therefore, as shown in FIG. 11B, in the power generation unit 100 according to the present embodiment, the displacement sensor 130 as a contactless sensor detects the displacement of the beam 104 in vibration to thereby control the switch SW.

Figure 12A:
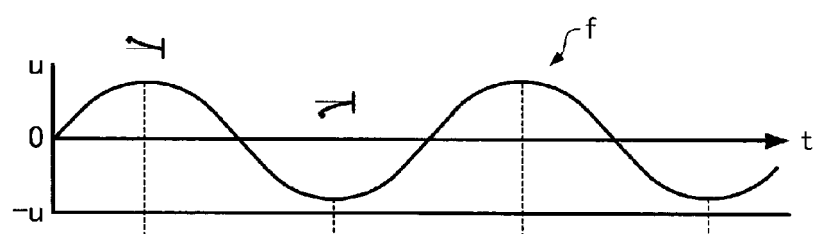
FIGS. 12A through 12C are explanatory diagrams showing the reason that a switch SW can be controlled at appropriate timings by detecting the displacement.
Figure 12B:
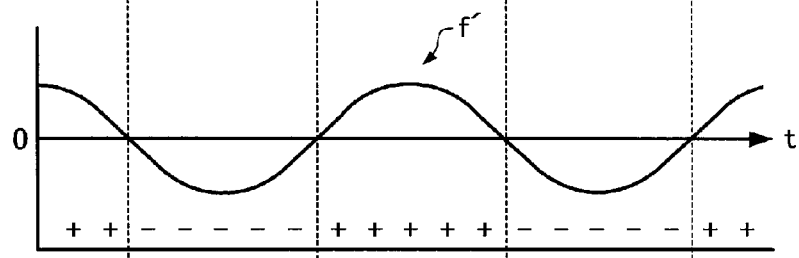
Figure 12C:
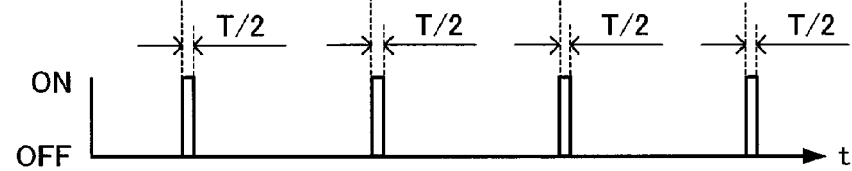

FIGS. 12A through 12C are explanatory diagrams showing the reason that the switch SW can be controlled at appropriate timings by detecting the displacement of the beam 104 in vibration by the displacement sensor 130. FIG. 12A shows the displacement of the beam 104. FIG. 12B shows the function f' obtained by temporally differentiating the function f representing the displacement thereof. Here, it is assumed that the displacement information from the displacement sensor 130 can discretely be obtained. In this case, the differential value specifically corresponds to the difference value between the displacement f(n) at the sampling timing n and the displacement f(n−1) at the previous sampling timing.

As described above, the electrical power can be generated with the highest efficiency in the case of setting the switch SW to the ON state at the timing at which the displacement of the beam 104 reaches the extreme value. As is obvious from the comparison between FIGS. 12A and 12B, the displacement of the beam 104 takes the extreme value at the timing at which the differential value reaches zero. In reality, since the displacement information from the displacement sensor 130 can discretely be obtained, it is possible to adopt the timing at which the sign of the differential value changes.

Therefore, as shown in FIG. 12B, the control circuit 112 detects the timing at which the sign changes from "+" to "−" and the timing at which the sign changes from "−" to "+," and then sets the switch SW to the ON state for the time period (T/2) half as long as the resonance period described above staring from the timing, and thus, it becomes possible to efficiently generate the electrical power.

In this case, since the beam 104 vibrates due to the external force, the magnitude (the amplitude) of the displacement of the vibration is diverse. However, in the present embodiment, the displacement of the beam 104 is detected using the displacement sensor 130 of the contactless type, and the control circuit 112 can accurately calculate the timing at which the displacement reaches the extreme value from the differential value based on the displacement information. In other words, the timing at which the displacement of the beam 104 reaches the extreme value can accurately be obtained regardless of the amplitude of the vibration.

Since it is sufficient for the control circuit 112 to detect only the inversion of the sign, reduction of the circuit size can be achieved. Specifically, the determination can be performed only by obtaining the displacement values f(n), f(n−1), and f(n−2) corresponding to the sampling timings up to the second previous one, and then comparing these values with each other.

Figure 13:
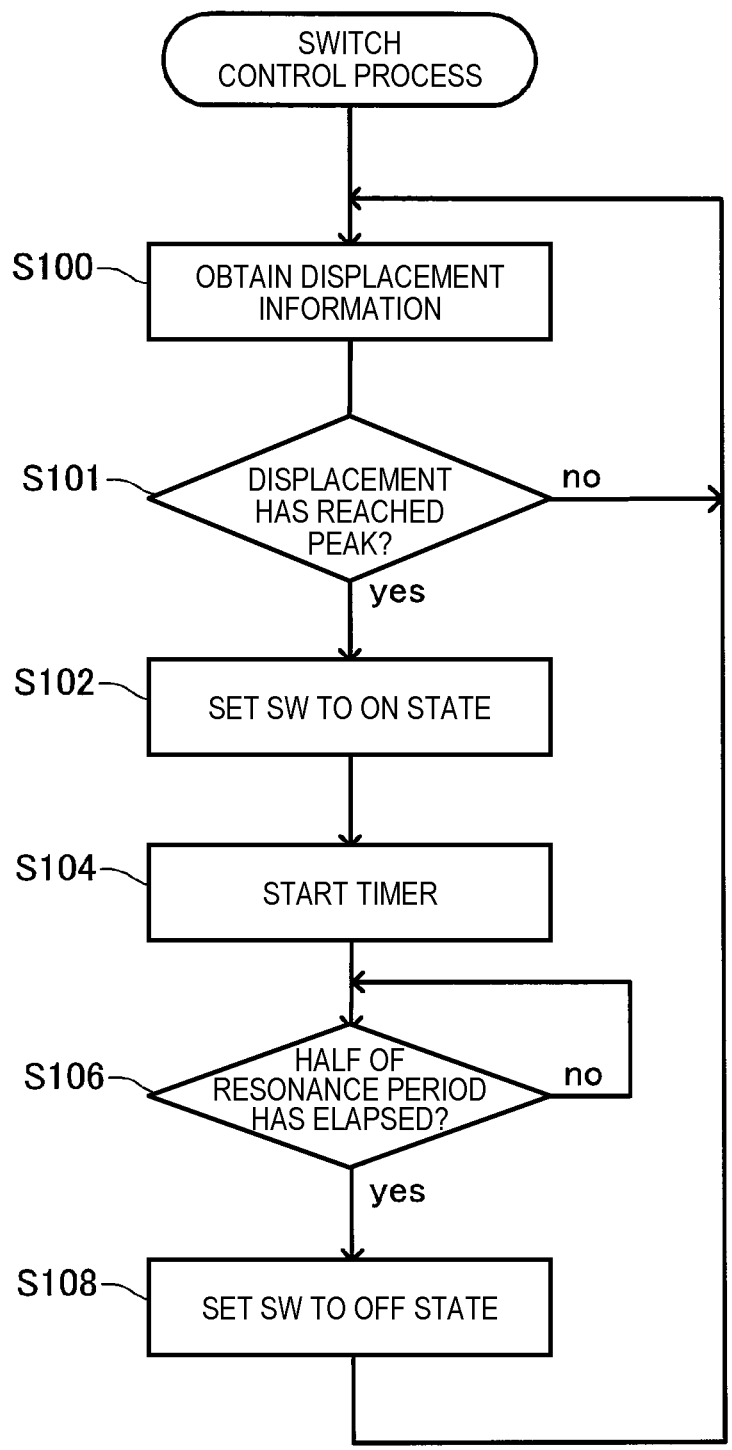
FIG. 13 is a flowchart showing a switch control process of switching between the ON and OFF states of the switch.

FIG. 13 is a flowchart showing a switch control process of switching between the ON and OFF states of the switch SW. This process is performed by a CPU incorporated in, for example, the control circuit 112.

When the switch control process is started, the CPU of the control circuit 112 obtains (step S 100) the displacement information representing the displacement of the beam104 from the displacement sensor 130. The CPU determines (step S101) whether or not the displacement of the beam 104 has reached the peak (the extreme value) based on the displacement information. As described above, whether or not the displacement of the beam 104 has reached the peak can be determined based on the change in the sign of the differential value.

If the peak of the displacement of the beam 104 is detected in such a manner as described above (yes in the step S101), the switch SW of the resonant circuit (the resonant circuit composed of the capacitor CO of the piezoelectric element 108 and the inductor L) is set to the ON state (step S102), and then a timer not shown incorporated in the control circuit 112 is started (step S104). Whether or not the time half as long as the resonance period of the resonant circuit composed of the capacitor CO of the piezoelectric element 108 and the inductor L has elapsed is determined (step S106). If the peak of the displacement of the beam 104 is not detected (no in the step S101), the CPU continues to obtain new displacement information until the peak is detected.

As a result, if it is determined that the period half as long as the resonance period has not yet elapsed (no in the step S106), the same determination is repeatedly performed to thereby continue the standby state until the period half as long as the resonance period elapses. If it is determined that the period half as long as the resonance period has elapsed (yes in the step S106), the switch SW of the resonant circuit is set (step S108) to the OFF state. Subsequently, the process returns to the top of the switch control process, and the series of processes described above are repeated.

By performing the ON/OFF control of the switch SW of the resonant circuit in such a manner as described hereinabove, the switch SW can easily be switched between the ON/OFF states at appropriate timings in accordance with the movement of the beam 104, and therefore, it becomes possible to efficiently generate the electrical power using the power generation unit 100.

D-3. Displacement Sensor

In the present embodiment, a contactless sensor is used as the displacement sensor 130. Since the contactless sensor is used, it is possible to make the control circuit 112 appropriately determine the peak of the vibration of the beam 104 with the diverse amplitude without hindering the deformation of the piezoelectric device.

Here, there are a variety of types of contactless sensors such as an optical type, an ultrasonic type, an eddy current type, and a capacitance type. The displacement of the beam 104 can be measured by any type of sensor. However, by using the eddy current type or the optical type each having a high response frequency, the detection accuracy can be improved. For example, some of the eddy current type or optical type sensors have a response frequency of several kHz to several tens kHz while the ultrasonic type or capacitance type sensors have a response frequency in a range of several tens Hz.

Figure 14A:
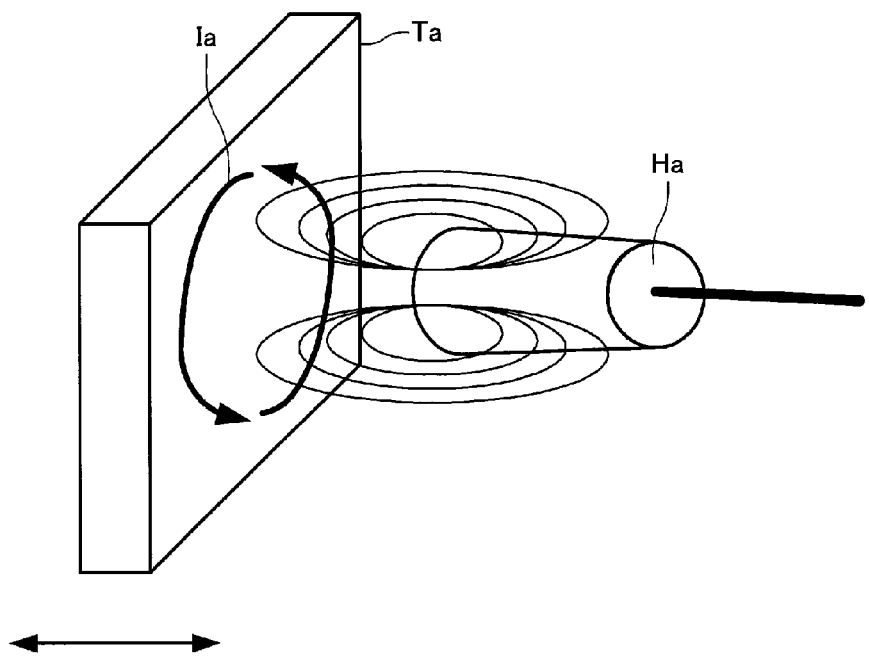
FIG. 14A is an explanatory diagram of an eddy current sensor.
Figure 14B:
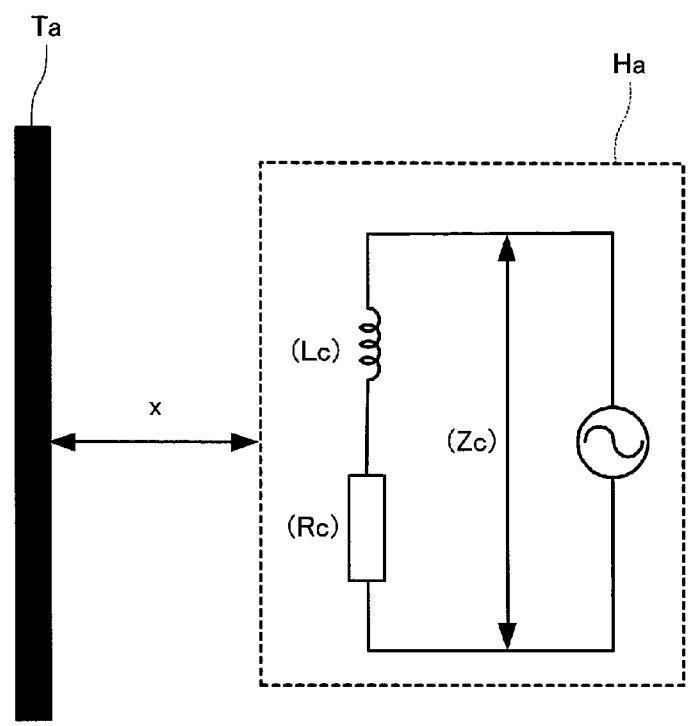
FIG. 14B is an explanatory diagram of the eddy current sensor.

FIGS. 14A and 14B are explanatory diagrams of an eddy current displacement sensor. FIG. 14A shows a head Ha of the displacement sensor and a detection object Ta. The detection object Ta moves back and forth against the head Ha.

The eddy current sensor supplies a detection coil included in the head Ha with a high-frequency signal of, for example, several MHz. Then, a high-frequency magnetic field is generated from the detection coil in such a manner as shown in FIG. 14A. When the detection object Ta made of metal comes closer, an eddy current Ia occurs on the surface of the metal. On this occasion, the level of the eddy current Ia varies in accordance with the distance between the head Ha (the detection coil) and the detection object Ta.

FIG. 14B shows an equivalent circuit of the detection coil of the head Ha. As shown in FIG. 14B, the equivalent circuit of the detection coil includes a resistor (having a resistance Rc) and an inductor (having an inductance Lc), and is supplied with a high-frequency signal. Here, the distance between the head Ha and the detection object Ta is defined as "x." In this case, the resistance Rc and the inductance Lc can be expressed as follows.

$$Rc = R0 + \Delta R(x)$$

$$Lc = L0 + \Delta L(x)$$

Here, R0, L0 are the values of the resistance Rc and the inductance Lc, respectively, with x taking an infinite value. When the distance x between the detection object Ta and the head Ha decreases, the eddy current Ia occurs to thereby make ΔR(x) and ΔL(x) have nonzero values. Since the eddy current Ia flows so as to generate a magnetic field canceling out the magnetic field surrounding the detection object Ta, ΔR(x) and ΔL(x) vary in accordance with the distance x. Then, it results that the impedance Zc of the detection coil of the head Ha also varies in accordance with the distance x.

The eddy current displacement sensor can calculate the distance x based on the variation in the impedance Zc of the detection coil. In other words, the eddy current displacement sensor can calculate the displacement of the detection object Ta.

Figure 15:
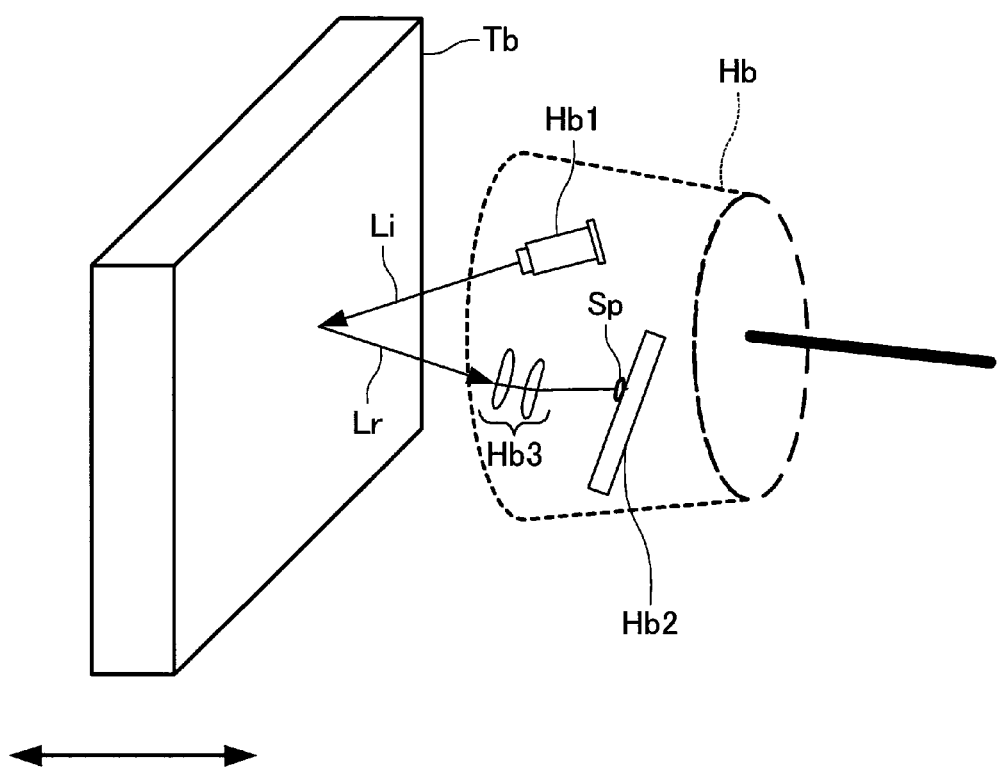
FIG. 15 is an explanatory diagram of an optical sensor.

FIG. 15 is an explanatory diagram of an optical displacement sensor. FIG. 15 shows a head Hb of the displacement sensor and a detection object Tb. The detection object Tb moves back and forth against the head Hb. The head Hb includes a light emitting element Hb1 and an optical position detection element Hb2. Light Li (e.g., a laser beam) is emitted from the light emitting element Hb1 toward the detection object Tb. The surface-reflected light Lr from the detection object passes through a light receiving lens Hb3, and forms a spot Sp on the optical position detection element Hb2. The optical displacement sensor can measure the displacement of the detection object Tb based on the variation in the position of the spot Sp.

Here, the eddy current displacement sensor uses the eddy current occurring on the surface of the metal. Therefore, the detection object (the beam 104 in the present embodiment) is limited to a conductive body such as metal. Therefore, if the beam 104 of the present embodiment is made of metal or coated with metal, the eddy current sensor can be used as the displacement sensor 130. In other cases, the optical sensor can also be used as the displacement sensor 130.

The ultrasonic displacement sensor emits an ultrasonic wave from a sensor head, and then receives the ultrasonic wave reflected back from the target object (the beam 104 here). The ultrasonic displacement sensor measures the time period from the emission of the ultrasonic wave to the reception thereof to thereby measure the distance (i.e., the displacement of the beam 104) from the beam 104. The distance LS from the beam 104 can be obtained by the following expression denoting the time period from the emission of the ultrasonic wave to the reception thereof by TS, and the sonic speed by CS.

$$LS=TS*CS/2$$

The accurate distance LS can be calculated with relative ease. The capacitance displacement sensor measures the displacement using the fact that the capacitance varies in inverse proportion to the distance between the electrodes. Therefore, a minute displacement can be measured.

E. Battery, Electronic Apparatus, And Transportation Device

Although the embodiments and the modified examples are hereinabove explained, the invention is not limited to the embodiments and the modified examples described above, but can be put into practice in various forms within the scope or the spirit of the invention.

For example, in the embodiments and the modified examples described above, the explanation is presented assuming that the piezoelectric element 108 is attached to the beam 104 having the cantilever structure. However, the piezoelectric element 108 can be attached to any member providing the member is easily deformed in a repeated manner due to a vibration or the like. For example, the piezoelectric element 108 can be attached to a surface of a thin film, or to a side surface of a coil spring.

If the ultracompact low power consumption displacement switches 130a, 130b or displacement sensor 130 can be used, such an application as to incorporate the power generation unit in a compact electronic apparatus such as a remote controller instead of a battery. In this case, it is also possible to perform the control of supplying the energy stored in the capacitor C1 in the previous power generation to the displacement detection switches 130a, 130b, or the displacement sensor 130 on a priority basis when using the compact electronic apparatus.

Although the power generation unit according to the invention can be miniaturized, the installation target is not limited to electronic apparatuses. For example, by applying the power generation unit according to the invention to a transportation device such as a vehicle or an electric train, it is also possible to generate power by the vibration due to the transportation, and to supply the electrical power efficiently to the equipment provided to the transportation device.

In this case, in order to cope with all of the vibrations, it is also possible to incorporate a plurality of power generation units 100 different in length of the beam 104 and weight of the mass 106 in the transportation device. In this case, it is also possible to constitute a power generating unit having the plurality of power generation units 100 fixed to the base 102 common to the power generation units 100.

Since the power generation unit according to the invention generates power in accordance with the vibration or the transportation, by installing the power generation unit on a bridge, a building, or a possible landslide place, it is also possible to generate electrical power at the time of disaster such as an earthquake, and to supply the electricity to a network device such as an electronic apparatus at only the time of need (disaster).

Further, the power generation unit according to the invention can be provided with the same shape as, for example, a button battery or a dry-cell battery, and can also be used in general electronic apparatuses instead of being installed in a specific apparatus or the like. In this case, since it is possible to charge the capacitor by a vibration, the power generation unit can be used as a battery even in the time of disaster with electricity lost. In this case, since the life thereof is longer than that of a primary cell, reduction of environmental load can be achieved in terms of a life cycle.

This application claims priority to Japanese Patent Application No. 2011-218921 filed on Oct. 3, 2011, and Application No. 2011-219033 filed on Oct. 3, 2011, the entirety of which is hereby incorporated by reference.

What is claimed is:

1. A power generation unit comprising:
 a deforming member adapted to deform while switching a deformation direction;
 a piezoelectric device provided to the deforming member,
 a displacement detection section adapted to detect that the deforming member is displaced beyond a predetermined level;
 an inductor electrically connected to the piezoelectric device;
 a switch disposed between the piezoelectric device and the inductor
 a capacitor electrically connected to the piezoelectric device;
 a full bridge rectifier disposed between the piezoelectric device and the capacitor; and
 a control section adapted to set the piezoelectric device and the inductor to an electrically conductive state via the switch when the displacement detection section detects that the deforming member is displaced beyond the predetermined level, wherein the inductor is connected in parallel to the piezoelectric device and the switch is connected in series to the inductor.

2. The power generation unit according to claim 1, wherein the displacement detection section is a mechanical switch having a mechanical contact, and the piezoelectric device and the inductor are set to the electrically conductive state if the deforming member has contact with the mechanical switch.

3. The power generation unit according to claim 1, further comprising:

a timing calculation section adapted to generate a timing at which a deformation direction of the deforming member is switched, wherein the control section sets the piezoelectric device and the inductor to one of a conductive state and a nonconductive state using the switch with the timing generated by the timing calculation section.

4. The power generation unit according to claim 1, wherein a number of the displacement detection sections is plural, a first displacement detection section as one of the displacement detection sections detects that a first surface as one of surfaces of the deforming member is displaced beyond a predetermined level, and a second displacement detection section different from the first displacement detection section detects that a surface different from the first surface is displaced beyond a predetermined level.

5. The power generation unit according to claim 1, wherein the displacement detection section is provided to the deforming member.

6. The power generation unit according to claim 1, wherein the displacement detection section includes an elastic member.

7. The power generation unit according to claim 1, wherein the deforming member has a plurality of surfaces, and the displacement detection section measures the displacement of the surface of the deforming member, the surface being provided with the piezoelectric device.

8. The power generation unit according to claim 1, wherein the displacement detection section is a sensor, and the control section differentiates the displacement detected by the displacement detection section, and then sets the switch to an electrically conductive state for a predetermined period if a sign of the differential value changes.

9. The power generation unit according to claim 1, wherein the displacement detection section is an eddy current sensor.

10. The power generation unit according to claim 1, wherein the displacement detection section is an optical sensor.

11. The power generation unit according to claim 1, wherein the displacement detection section is an ultrasonic sensor.

12. The power generation unit according to claim 1, wherein the displacement detection section is a capacitance sensor.

13. The power generation unit according to claim 1, wherein the displacement detection section is of one of a contact type and a contactless type.

14. A battery comprising the power generation unit according to claim 1.

15. An electronic apparatus comprising the power generation unit according to claim 1.

16. A transportation device comprising the power generation unit according to claim 1.

17. A method of controlling a power generation unit including a deforming member adapted to deform while switching a deformation direction, a piezoelectric device provided to the deforming member, a displacement detection section adapted to detect that the deforming member is displaced beyond a predetermined level, an inductor electrically connected to the piezoelectric device, and a switch disposed between the piezoelectric device and the inductor, a capacitor electrically connected to the piezoelectric device, and a full bridge rectifier disposed between the piezoelectric device and the capacitor, wherein the inductor is connected in parallel to the piezoelectric device and the switch is connected in series to the inductor, the method comprising:

detecting that the deforming member is displaced beyond a predetermined level by a displacement detection section; and setting the piezoelectric device and the inductor to an electrically conductive state via the switch when the displacement detection section detects that the deforming member is displaced beyond the predetermined level.

* * * * *